United States Patent
Shay et al.

(10) Patent No.: US 10,033,271 B1
(45) Date of Patent: Jul. 24, 2018

(54) MULTI-STAGE CHARGE PUMP

(71) Applicant: TEXAS INSTRUMENTS INCORPORATED, Dallas, TX (US)

(72) Inventors: Michael John Shay, Fairview, TX (US); Jialei Xu, Santa Clara, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/395,175

(22) Filed: Dec. 30, 2016

(51) Int. Cl.
  *H02M 3/07* (2006.01)
  *H03K 19/0175* (2006.01)

(52) U.S. Cl.
  CPC ...... *H02M 3/07* (2013.01); *H03K 19/017509* (2013.01)

(58) Field of Classification Search
  CPC .............................................. H02M 2003/076
  See application file for complete search history.

(56) References Cited

U.S. PATENT DOCUMENTS

| | | | |
|---|---|---|---|
| 6,486,728 B2 | 11/2002 | Kleveland | |
| 6,876,238 B1 | 4/2005 | Kelkar et al. | |
| 7,098,725 B2 | 8/2006 | Lee | |
| 7,256,640 B2 | 8/2007 | Ucciardello et al. | |
| 7,259,611 B2 * | 8/2007 | Tanimoto | H02M 3/073 327/536 |
| 7,579,902 B2 * | 8/2009 | Frulio | G11C 5/145 327/536 |
| 8,421,523 B2 * | 4/2013 | Kwon | G11C 5/145 327/536 |
| 8,848,476 B2 * | 9/2014 | Kuo | G11C 5/145 327/536 |
| 9,494,963 B2 | 11/2016 | Li | |
| 2006/0145747 A1 | 7/2006 | Ucciardello et al. | |
| 2007/0047352 A1 | 3/2007 | Lin et al. | |
| 2009/0261891 A1 | 10/2009 | Yeh et al. | |
| 2015/0249383 A1 | 9/2015 | Li et al. | |
| 2016/0308435 A1 | 10/2016 | de Cremoux | |

* cited by examiner

*Primary Examiner* — Jeffrey Zweizig
(74) *Attorney, Agent, or Firm* — Michael A. Davis, Jr.; Charles A. Brill; Frank D. Cimino

(57) ABSTRACT

In described examples, a multi-stage charge pump includes first, second and third charge pump stages connected in series. Each of the first, second and third charge pump stages includes a charge pump circuit of a first type that increases an input signal of a respective charge pump circuit by up to a given amount. The multi-stage charge pump also includes a level shifter that swings a level clock signal between a voltage of an output signal of the third charge pump stage and one of an offset voltage and ground. The multi-stage charge pump further includes a charge pump circuit of a second type that increases the voltage of the output of the third charge pump stage by up to another amount and provides an output and the other amount is set by the level shifter. Also, the multi-stage charge pump includes a charge pump circuit of a third type.

20 Claims, 8 Drawing Sheets

MULTI-STAGE CHARGE PUMP

TECHNICAL FIELD

This relates generally to electronic circuitry, and more particularly to a multi-stage charge pump.

BACKGROUND

A DC-to-DC converter is an electronic circuit or electromechanical device that converts a source of direct current (DC) from one voltage level to another. An example type of DC-to-DC converter is a charge pump that employs at least one capacitor as an energy-storage element to create either a higher or lower voltage power source. In the example charge pump, switching devices control the connection of voltages to the at least one capacitor. In at least one example, a two-stage cycle charge pump generates a higher pulsed voltage from a lower-voltage supply. In the first stage of the cycle, the circuit is switched to a condition in which the capacitor is connected across the supply, thereby charging the capacitor to that same voltage. In the second stage of the cycle, the circuit is switched to a condition in which the capacitor is in series with the supply to the load. This two-stage cycle effectively provides nearly double the supply voltage to the load (by providing a sum of the original supply voltage plus the at least one capacitor's voltage). In at least one example, an output capacitor smooths the pulsing nature of the higher-voltage output.

SUMMARY

In a first example, a multi-stage charge pump includes first, second and third charge pump stages connected in series. Each of the first, second and third charge pump stages includes a charge pump circuit of a first type that increases an input signal of a respective charge pump circuit by up to a given amount. The multi-stage charge pump also includes a level shifter that swings a level clock signal between a voltage of an output signal of the third charge pump stage and one of an offset voltage and ground. The multi-stage charge pump further includes a charge pump circuit of a second type that increases the voltage of the output of the third charge pump stage by up to another amount and provides an output and the other amount is set by the level shifter. Also, the multi-stage charge pump includes a charge pump circuit of a third type that increases a voltage of the output of the second charge pump stage by up to about the other amount that is set by the level shifter.

In a second example, an integrated circuit (IC) chip includes first, second and third charge pump stages connected in series. Each of the first, second and third charge pump stages increases an input signal of a respective charge pump circuit by up to a given amount. The IC chip also includes a biasing circuit that generates an offset voltage in response to an input of the first charge pump stage and an output of the first, second and third charge pump stages. The IC chip further includes a level shifter that swings a clock signal between a voltage of the output of the third charge pump stage and a ground in a turbo mode and swings the clock signal between a voltage of the output of the third charge pump stage and the offset voltage in a steady state mode. Also, the IC chip includes a fourth charge pump stage that increases the voltage of the output of the third charge pump stage by up to another amount and provides an output. Each of the first, second, third and fourth charge pump stages excludes metal plate capacitors. Further, the IC chip includes a fifth charge pump stage that increases a voltage of the output of the fourth charge pump stage by up to about the other amount.

In a third example, an IC chip includes charge pump stages connected in series. Each of the charge pump stages includes a charge pump circuit of a first type. The IC chip also includes a biasing circuit that generates an offset voltage in response to an output from the charge pump stages and an input signal applied to a first charge pump stage of the charge pump stages. The IC chip further includes a level shifter that swings a clock signal between a voltage of the output signal of a last charge pump stage of the charge pump stages and ground in a turbo mode and swings the clock signal between a voltage of the output signal of the last charge pump stage of the charge pump stages and the offset voltage in a steady state mode. Also, the IC chip includes a next charge pump circuit comprising a charge pump circuit of a second type. The next charge pump circuit increases the voltage of the output of the last charge pump stage in the charge pump stages by up to an amount approximating the output of the last charge pump stage in the charge pump stages and provides an output.

DETAILED DESCRIPTION

Figure 1:
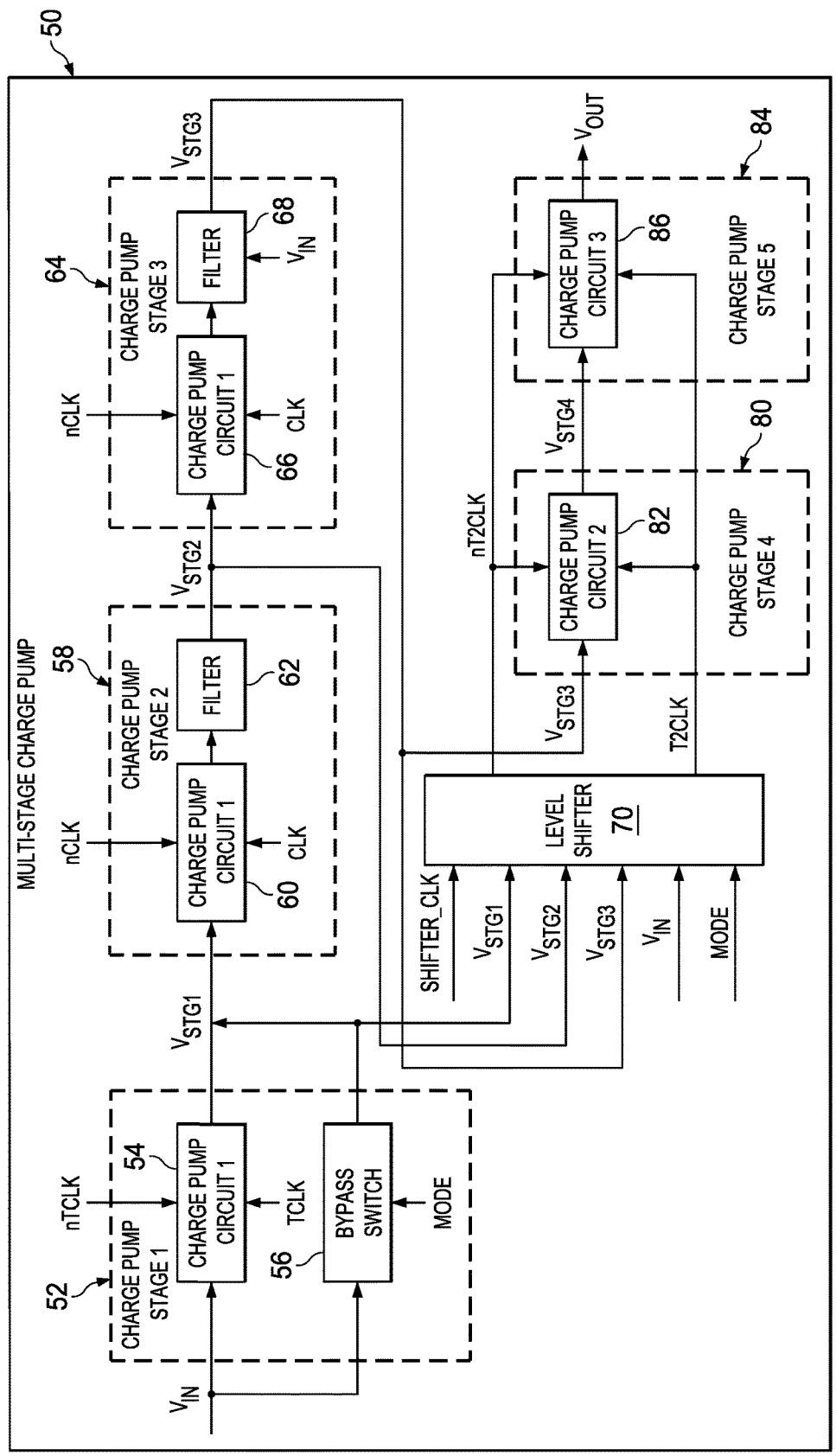
FIG. 1 is a diagram of an example of a multi-stage charge pump.

In at least one example, a multi-stage charge pump: (a) is implemented on an integrated circuit (IC) chip; (b) has multiple modes of operation, such as a turbo mode (e.g., start-up or initialization) and a steady state mode; and (c) includes first, second and third charge pump circuits connected in series. In the turbo mode, each of the first, second and third charge pump circuits increases an input signal of a respective charge pump circuit by a first amount according to the type of charge pump. In at least one example, in the steady state mode, the first charge pump circuit is bypassable, and the second and third charge pump circuits increase the input signal by a second amount. In some examples, the first, second and third charge pump circuits have the same design.

The input signal is trimmed to about 5.5 V to about 6.5 V (e.g., about 6 V). Moreover, due to changing load impedances, the second and third charge pump circuits increase the voltage of the input signal by a greater amount in the steady state mode than the turbo mode. Thus, the first charge pump circuit is bypassable in the steady state mode to adjust the net voltage increase of the multi-stage charge pump.

In at least one example, the multi-stage charge pump has a biasing circuit that generates an offset voltage in response to an output of the first, second and third charge pump circuits. The offset voltage is output to a level shifter that provides a clock signal that swings between about a voltage level of the output signal of the third charge pump circuit and about an electrically neutral level (e.g., ground, such as about 0 V) in the turbo mode. Also, the clock signal swings between about the voltage level of the output signal of the third charge pump circuit and about the offset voltage in the steady state mode.

In some examples, the multi-stage charge pump further includes a fourth charge pump circuit that increases the voltage of the output of the third charge pump circuit by a third amount (e.g., about 10-12 V) and provides an output signal. In at least one example, the multi-stage charge pump includes a fifth charge pump circuit that increases a voltage of the output signal of the fourth charge pump circuit by the third amount to generate an output signal that is about 38-40 V.

The multi-stage charge pump is configurable, such that the first-fourth charge pump circuits are implemented with polysilicon capacitors that are relatively small and energy efficient. In at least one example, capacitors in the first-fourth charge pump circuits are exposed to a voltage swing of about 12 V or less in the steady state mode and about 18 V or less in the turbo mode. Because the multi-stage charge pump operates in the turbo mode for a small fraction (e.g., about 1% or less) of the duty cycle, and operates in the steady state mode the remaining portion of the duty cycle, the polysilicon capacitors of the first-fourth stages of the multi-stage charge pump operates within acceptable reliability parameters. As used herein, the term "duty cycle" refers to an overall active operational time of the multi-stage charge pump. Accordingly, the multi-stage charge pump operates in the turbo mode the small fraction (e.g., about 1% or less) of the overall operational time of the multi-stage charge pump, and operates in the steady state mode for the remaining portion of the overall operational time. Moreover, in at least one example, metal plate capacitors are employed in the fifth (e.g., the last or output) charge pump circuit, because the capacitors in this charge pump circuit are exposed to a voltage drop of up to about 24 V in the steady state mode and up to about 30 V or more in the turbo mode. By limiting the metal plate capacitors to the output stage of the multi-stage charge pump, greater space efficiency of a die of the IC chip is achievable along with significant cost savings.

FIG. 1 is a block diagram of a multi-stage charge pump 50 implemented on an IC chip. In at least one example, the multi-stage charge pump 50 is a form of a DC-to-DC converter. For example, the multi-stage charge pump 50 is employable in a microelectromechanical systems (MEMS) device or another device where a relatively high output voltage, $V_{OUT}$ (e.g., about 35 Volts (V) or more) is needed or desired. In at least one example, the features of the multi-stage charge pump 50 are integrated in a discrete IC chip. In at least one other example, the features of the multi-stage charge pump 50 are integrated with other features to implement another system, such as in a system on a chip (SoC) architecture.

The multi-stage charge pump 50 operates in two different modes, namely in a turbo ramping mode (or simply "turbo mode") and in a steady state or normal mode. In at least one example, the multi-stage charge pump 50 receives a mode signal (labeled in FIG. 1 as "MODE") that characterizes an operational mode of the multi-stage charge pump 50. For clarity, some signals (such as the mode signal) are shown and described in FIG. 1 as being a single signal. However, in at least one example, such signals are representative of multiple signals, including a complement (inverse) of a signal or having one or more other values encoded in the signal(s). Generally, the multi-stage charge pump 50 operates in the turbo mode in situations where the output voltage $V_{OUT}$ is being ramped up to a threshold voltage, such as a threshold voltage within a range of about 30 V to about 40 V. Upon reaching the threshold voltage, the multi-stage charge pump 50 switches to the steady state mode.

The multi-stage charge pump 50 includes a first charge pump stage 52 (labeled in FIG. 1 as "CHARGE PUMP STAGE 1") that receives an input signal, $V_{IN}$. In at least one example, the input signal $V_{IN}$ is a direct current (DC) signal with a trimmed voltage that in a range, such as between about 5.5 V and about 6.5 V. In at least one example, the first charge pump stage 52 includes an instance of a first charge pump circuit 54.

In this example, the first charge pump circuit 54 includes analog circuitry (e.g., an arrangement of active and passive circuit components) that adds (e.g., "pumps") a voltage to $V_{IN}$ through a charge pump process to form an output signal that is greater than $V_{IN}$. The first charge pump circuit 54 operates in one of plural modes based on a received turbo clock signal, TCLK and a negative (complement) of the turbo clock signal, nTCLK. For example, the negative turbo clock signal, nTCLK is an inverted version of the turbo clock signal TCLK. Due to changing impedances in the multi-stage charge pump 50, the first charge pump stage 52 operates differently in the turbo mode and the steady state mode. In the turbo mode, the first charge pump circuit 54 ramps up to adding a predetermined voltage (e.g., about 6 V). In the steady state mode, the first charge pump circuit 54 is bypassable. The bypassing removes the pumping action implemented by the pump circuit 54, thereby reducing the net pumping of the multi-stage charge pump 50. In at least one example, the first charge pump circuit 54 is fabricated with high density, non-metal capacitors, such as polysilicon capacitors. Polysilicon capacitors are fabricated with an insulator formed of a highly doped N-type insulator. Moreover, polysilicon capacitors have a lower breakdown voltage than metal plate (MFLUX) capacitors, but polysilicon capacitors achieve greater space efficiency (e.g., about one-fourth the die area for a same size capacitor). The term, polysilicon capacitor is often abbreviated as "poly cap."

The first charge pump stage 52 also includes a bypass switch 56 to implement the aforementioned bypassing of the first charge pump circuit 54. In at least one example, the bypass switch 56 short circuits the input and the output of the first charge pump circuit 54 of the first charge pump stage 52. In at least one example, the bypass switch 56 is controlled by the mode signal. In this example, the bypass switch 56 is configured such that in situations where the mode signal indicates that the multi-stage charge pump 50 is operating in turbo mode, the bypass switch 56 is turned off, such that the input signal, $V_{IN}$ traverses the first charge pump circuit 54 of the first charge pump stage 52. Conversely, in this example, in situations where the mode signal indicates that the multi-stage charge pump 50 is operating in the steady state mode, the bypass switch 56 short circuits the first charge pump circuit 54 of the first charge pump stage 52 by electrically connecting the input and output of the first charge pump circuit.

In at least one example, the first charge pump stage 52 generates an output signal, $V_{STG1}$. In this example, in the steady state mode, the output signal, $V_{STG1}$ is a signal nearly equal to the input signal, $V_{IN}$ due to the bypassing operation. In at least one example, the input signal, $V_{IN}$ has a voltage about 5.5 V to about 6.5 V. In an example where the input signal, $V_{IN}$ is about 6 V, the output signal $V_{STG1}$ ramps from about 0 V to about 6 V greater than the input signal, $V_{IN}$, such that the output signal, $V_{STG1}$ has a voltage of about 6 V to about 12 V. In this description, the specific voltage levels provided are examples. In other examples, voltage levels at different scales (greater or less) are employed.

The output signal $V_{STG1}$ of the first charge pump stage 52 feeds into a second charge pump stage 58 (labeled in FIG. 1 as "CHARGE PUMP STAGE 2") as an input voltage to the second charge pump stage 58 and to an input of a level shifter 70. In at least one example, the second charge pump stage 58 includes another instance of the first charge pump circuit 60. In this example, the first charge pump circuit 60 of the second charge pump stage 58 receives a clock signal, CLK and a negative clock signal, nCLK that is an inverted version of the clock signal. The clock signal, CLK has a lower frequency than the turbo clock signal, TCLK that is provided to the first charge pump circuit 54 of the first charge pump stage 52. The first charge pump circuit 60 of the second charge pump stage 58 ramps up to adding about 4 V to the output of the first charge pump stage 52, $V_{STG1}$ in the turbo mode and adds about 6 V to the output of the first charge pump stage 52 $V_{STG1}$ in the steady state mode. In this example, the output of the first charge pump circuit 60 of the second stage charge pump 58 is fed to a filter 62 (e.g., a low pass filter) of the second charge pump stage 58.

In at least one example, the filter 62 includes a polysilicon capacitor that smooths the output of the first charge pump circuit 60 of the second charge pump stage 58. In at least one example, the output of the filter 62 is the output of the second charge pump stage 58, $V_{STG2}$. Due to changing impedances in the multi-stage charge pump 50, the first charge pump circuit 60 of the second charge pump stage 58 increases the voltage by a different amounts in the turbo mode and the steady state mode. In at least one example, in the turbo mode, $V_{STG2}$ ramps up to about 14 V. In this example, in the steady state mode, $V_{STG2}$ has a voltage level of about 12-13 V because, in the steady state mode, the first charge pump circuit 54 of the first charge pump stage 52 is bypassed.

The output of the second charge pump stage 58, $V_{STG2}$ feeds into a third charge pump stage 64 and to another input of the level shifter 70 (e.g., into a biasing circuit of the level shifter 70, as described herein). In at least one example, the third charge pump stage 64 includes yet another instance of the first charge pump circuit 66. In this example, the first charge pump circuit 66 also receives the clock signal, CLK and the negative clock signal, nCLK. In this example, the first charge pump circuit 66 of the third charge pump stage 64 ramps up to adding about 4 V to $V_{STG2}$ while the multi-stage charge pump 50 operates in the turbo mode. Also, the first charge pump circuit 66 of the third charge pump stage 64 adds about 6 V to $V_{STG2}$ while the multi-stage charge pump 50 operates in the steady state mode. The output of the first charge pump circuit 66 of the third charge pump stage 64 feeds into a filter 68 (e.g., a low pass filter). In at least one example, the filter 68 includes a polysilicon capacitor coupled to the input signal, $V_{IN}$ to generate an output signal of the third charge pump stage 64, $V_{STG3}$. The output of the filter 68 is the output of the third charge pump stage 64, $V_{STG3}$.

Due to changing impedances in the multi-stage charge pump 50, the first charge pump circuit 66 of the third charge pump stage 64 increases the voltage by different amounts in the turbo mode and the steady state mode. However, in at least one example, the output of the third charge pump stage 64, $V_{STG3}$ is about 18 V (+/− about 2 V) in both the steady state mode and the turbo mode. By accounting for the start-up conditions, such as a low-impedance of the first charge pump circuits 54, 60 and 66 in the turbo mode and controlling the bypass switch 56, the output of the third charge pump stage 64, $V_{STG3}$ is about equal (e.g., within about 2 V) if the multi-stage charge pump 50 operates in either the turbo mode or the steady state mode. For clarity, FIG. 1 shows the output of the third charge pump stage 64, $V_{STG3}$ as connected to an input of the level shifter 70.

In at least one example, the level shifter also receives a shifter clock signal, SHIFTER_CLK. The shifter clock signal, SHIFTER_CLK has a predetermined frequency. In this example, the level shifter 70 also receives the mode signal. Also, in some examples, the input signal, $V_{IN}$, the output of the first charge pump stage 52, $V_{STG1}$ and the output of the second charge pump stage 58, $V_{STG2}$ are also fed into the level shifter 70 (e.g., in a biasing circuit, as described herein).

In at least one example, the level shifter 70 is a circuit that generates a level clock signal, T2CLK with a frequency about equal to the frequency of the shifter clock, SHIFTER_CLK. For example, the clock signal, T2CLK swings between 0 V and $V_{STG3}$ in (e.g., between about 0 V and about 18 V) in the turbo mode. In the steady state mode, the clock signal, T2CLK swings between about $V_{STG1}$ and $V_{STG3}$ (e.g., between about 6 V and about 18 V). In at least one example, the level shifter 70 outputs the level clock signal, T2CLK and the negative (complement) of the level clock signal, n2CLK, which is an inverted version of the level clock signal, T2CLK.

In at least one example, the level clock signal, T2CLK and the negative level clock signal, nT2CLK are provided to a fourth stage charge pump 80 (labeled in FIG. 1 as "CHARGE PUMP STAGE 4"). The fourth charge pump stage 80 includes a second charge pump circuit 82 (labeled in FIG. 1 as "CHARGE PUMP CIRCUIT 2"). The second charge pump circuit 82 receives the level clock signal, T2CLK and the negative level clock signal, nT2CLK. In this example, the second charge pump circuit 82 also receives the output of the third charge pump stage, $V_{STG3}$ as an input signal.

In at least one example, the second charge pump circuit 82 of the fourth charge pump stage 80 boosts $V_{STG3}$ by about 10-12 V to generate an output signal, $V_{STG4}$ for the fourth charge pump stage 80. The amount of voltage added by the second charge pump circuit 82 varies based on a power conversion efficiency. In at least one example, the second charge pump circuit 82 includes polysilicon capacitors to facilitate the boosting of the voltage of the input signal, $V_{STG3}$ For example, the output signal, $V_{STG4}$ of the fourth charge pump stage 80 has a voltage level of about 28-30 V. Moreover, in at least one example, the output signal of the fourth charge pump stage 80, $V_{STG4}$ is fed to a fifth charge pump stage 84.

In at least one example, the fifth charge pump stage 84 includes a third charge pump circuit 86 that receives the output of the fourth charge pump stage 80, $V_{STG4}$ as an input. In this example, the fifth charge pump stage 84 also receives the level clock signal, T2CLK and the negative level clock signal, nT2CLK as input into the third charge pump circuit 86.

In at least one example, the third charge pump circuit 86 of the fifth charge pump stage 86 boosts $V_{STG4}$ by about 10-12 V to generate an output signal $V_{OUT}$ for the multi-stage charge pump 50. In at least one example, the third charge pump circuit 86 is a circuit with metal plate capacitors (also referred to as MFLUX capacitors) to facilitate the boosting of the output of the fourth charge pump stage 80, $V_{STG4}$. The output signal, $V_{OUT}$ of the fifth charge pump stage 84 (and the output of the multi-stage charge pump 50) has a voltage level of about 38-40 V. In at least one example, the output signal, $V_{OUT}$ drives a load (not shown).

In at least one example, by implementing the multi-stage charge pump 50 in the manner described, the input signal, $V_{IN}$ is boosted from about 5.5-6.5 V to about 38-40 V. Also, the multi-stage charge pump 50 has a high duty cycle in the steady state mode, such as about 99% or more, where the polysilicon capacitors operating in the first charge pump circuits 54, 60 and 66 and the second charge pump circuit 82 are exposed to a voltage swing less than about 12 V. Accordingly, the polysilicon capacitors operate within standard reliability parameters in the steady state mode. Also, in at least one example, in the steady state mode, the metal plate capacitors of the third charge pump circuit 86 are exposed to a voltage swing up to about 24 V, while still operating within standard reliability parameters. As used herein, the term "reliability parameters" denotes a predetermined acceptable exposure of voltage swing for a duty cycle. In these examples, reliability parameters dictate that the smaller the duty cycle, the larger the voltage swing that is acceptable.

Furthermore, the multi-stage charge pump 50 has a duty cycle in the turbo mode of about 1% or less, in which the polysilicon capacitors of the second charge pump circuit 82 are exposed to an increased voltage swing, such as less than about 18 V. In at least one example, due to the low duty cycle (1% or less) in the turbo mode of the multi-stage charge pump 50, the polysilicon capacitors still operate within standard reliability parameters despite the increased voltage swing.

Also, in at least one example, in the turbo mode, the metal plate capacitors of the third charge pump circuit 86 are exposed to a voltage swing of about 30 V, while still operating within standard reliability parameters. In this example, in the steady state mode the metal plate capacitors of the third charge pump circuit 86 are exposed to a voltage swing of about 24 V, while still operating within standard reliability parameters. Thus, by operating the multi-stage charge pump 50 in the turbo mode with a low duty cycle (e.g., about 1% duty cycle or less), the capacitors of the first charge pump circuits 54, 60 and 66, the second charge pump circuit 82 and the third charge pump circuit 86 operate within acceptable reliability parameters.

Furthermore, by limiting use of the metal plate capacitors to fifth charge pump stage 84 (at the third charge pump circuit 86), a reduced die area and increased power efficiency is achievable in examples where the multi-stage charge pump 50 is implemented on an IC chip. Stated differently, by employing mostly relatively physically small, power efficient polysilicon capacitors in the multi-stage charge pump 50 (specifically at the first-fourth charge pump stages 52, 58, 64, and 80), the multi-stage charge pump 50 is deployable on a relatively small portion of a die.

Figure 2:
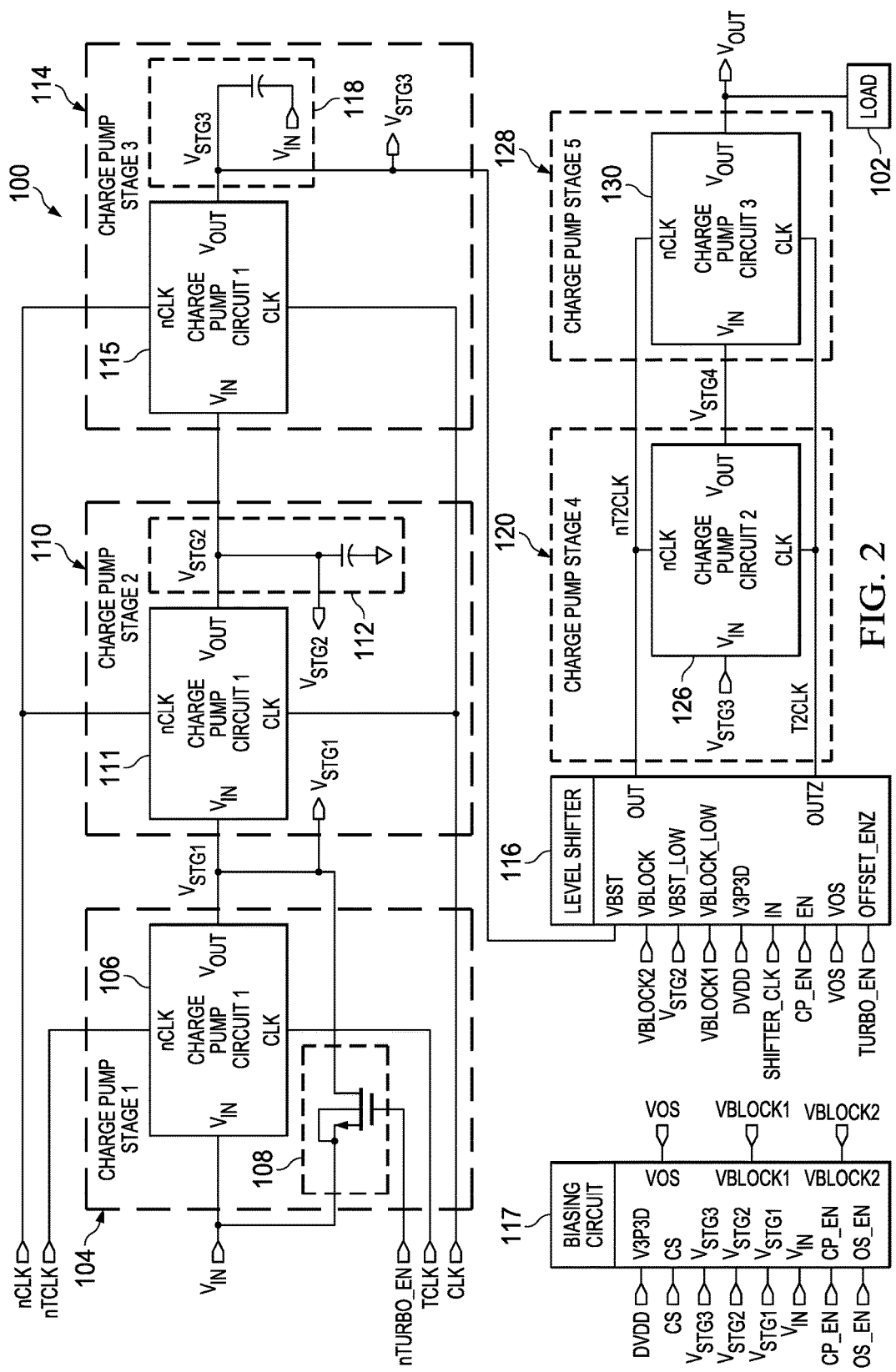
FIG. 2 is a diagram of another example of a multi-stage charge pump.

FIG. 2 is a block diagram of another example multi-stage charge pump 100 implemented on an IC chip. In at least one example, the multi-stage charge pump 100 is employed to implement the multi-stage charge pump 50 of FIG. 1. In at least one example, the multi-stage charge pump 100 be a DC-to-DC converter. In at least one example, the multi-stage charge pump 100 drives a MEMS device or another device where a relatively high output voltage, $V_{OUT}$ (e.g., 30 Volts (V) or more) is needed or desired. The device driven by the multi-stage charge pump 100 is schematically shown as a load 102. In at least one example, the features of the multi-stage charge pump 100 are implemented in a discrete IC chip. In at least one other example, the features of the multi-stage charge pump 100 are integrated with other features to implement a particular architecture, such as in an SoC architecture.

In at least one example, the multi-stage charge pump 100 operates in two different modes, namely a turbo mode and a steady state (normal mode). In this example, the multi-stage charge pump 100 receives a turbo mode enable signal (labeled in FIG. 2 as "TURBO_EN") and a negative (complement) turbo mode enable signal (labeled in FIG. 2 as "nTURBO_EN") that characterize an operational mode of the multi-stage charge pump 100. The turbo mode signal and the complement of the turbo mode enable signal correspond to the turbo mode signal shown in FIG. 1. Generally, the multi-stage charge pump 100 operates in the turbo mode in situations where the output voltage, $V_{OUT}$ is being ramped up to a threshold voltage within a range of about 30 V to about 40 V. Upon reaching the threshold voltage, the multi-stage charge pump 100 switches to the steady state mode.

In this example, the multi-stage charge pump 100 includes a first charge pump stage 104 (labeled in FIG. 1 as "CHARGE PUMP STAGE 1") that receives an input signal, $V_{IN}$. In at least one example, the input signal, $V_{IN}$ is a DC signal with a voltage that in a range of about 5 V to about 7 V (e.g., about 5.5-6.5 V). In this example, the first charge pump stage 104 includes an instance of a first charge pump circuit 106. The first charge pump circuit 106 of the first charge pump stage 104 receives a turbo clock signal, TCLK and a negative (complement) turbo clock signal nTCLK that is an inverted version of the turbo clock signal, TCLK.

In at least one example, the first charge pump circuit 106 of the first charge pump stage 104 includes analog circuitry (e.g., active and passive circuit components) that adds (e.g., "pump") a voltage to $V_{IN}$ through a charge pump process. Due to start-up conditions, (particularly impedance of circuit components of the first charge pump circuit 106), the first charge pump circuit 106 of the first charge pump stage 104 adds voltage while operating in the turbo mode based on the turbo enable signal, nTURBO_EN. In the steady state mode, the first charge pump circuit 106 of the first charge pump stage 104 is bypassed, as described herein.

Figure 3:
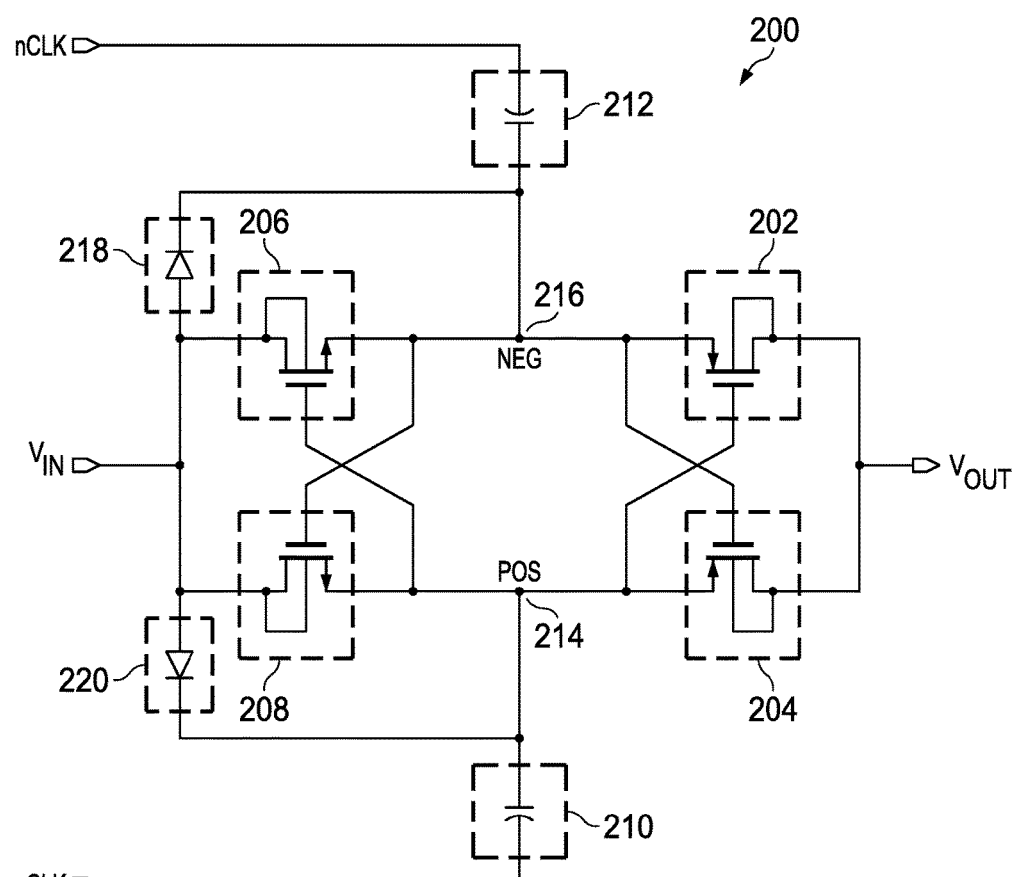
FIG. 3 is a circuit diagram of an example of a first charge pump circuit.

FIG. 3 is a circuit diagram of a first charge pump circuit 200 that, in at least one example, implements (multiple instances of) the first charge pump circuits 54, 60 and 66 of FIGS. 1 and 106, 111 and 115 of FIG. 2. In this example, the first charge pump circuit 200 includes a first p-channel metal-oxide-semiconductor field effect transistor (PMOS) 202 and a second PMOS 204. Also, the first charge pump circuit 200 includes a first n-channel metal-oxide-semiconductor field effect transistor (NMOS) 206 and a second NMOS 208.

In at least one example, an input signal, $V_{IN}$ is coupled to a drain of the first NMOS 206 and the second NMOS 208. A clock signal, CLK is coupled to a terminal of a first capacitor 210. A negative (complement) clock signal, nCLK is coupled to a terminal of a second capacitor 212. The negative clock signal, nCLK is an inverted version of the clock signal, CLK. In at least one example, the first capacitor 210 is coupled (at another terminal) to a positive node 214 of the first charge pump circuit 200 (labeled in FIG. 2 as "POS"). In this example, the second capacitor 212 is coupled (at another terminal) to a negative node 216 of the first charge pump circuit 200 (labeled in FIG. 2 as "NEG").

In this example, the positive node 214 is coupled to a gate of the first PMOS 202 and a gate of the first NMOS 206. In at least one example, the positive node 214 is also coupled to a source of the second PMOS 204 and a source of the second NMOS 208. The negative terminal 216 is coupled to a gate of the second PMOS 204 and a gate of the second NMOS 208. The input signal, $V_{IN}$ is coupled to a negative terminal of a first diode 218 and to the negative terminal of a second diode 220. In at least one example, a positive terminal of the first diode 218 is coupled to the negative node 216 and a positive terminal of the second diode 220 is coupled to the positive node 214. In this example, the first charge pump circuit 200 generates an output signal, $V_{OUT}$.

In operation, initially the input signal, $V_{IN}$ passes through the first diode 218 to partially charge the negative node 216 and pass through second diode 220 to partially charge the positive node 214. Thus, the negative node 216 and the positive node 214 has an initial voltage about equal to the input signal, $V_{IN}$ minus a diode drop voltage across the first diode 218 and the second diode 220, respectively.

Also, the clock signal, CLK swings between about 0 V and about 6 V at a controlled frequency (dictated by an external circuit). During a high clock pulse of the clock signal, CLK (at which CLK is about 6 V), the negative clock signal, nCLK is about 0 V. Thus, during a high clock pulse of the clock signal, CLK, (via the first capacitor 210) the clock signal, CLK charges (e.g., "pumps voltage") the positive node 214. During the high clock pulse of the clock signal, CLK, the gate of the second PMOS 204 is lower than the voltage of the source of the positive node 214. This occurs because the gate of the second PMOS 204 coupled to the negative node 216, and the negative node 216 is charged by the negative clock signal, nCLK (which is at about 0 V) during a high clock pulse of the clock signal, CLK. Thus, during a high clock pulse of the clock signal, CLK, the second PMOS 204 is turned on (e.g., operating in the saturation mode). Conversely, during a high clock pulse of the clock signal, CLK, the second NMOS 208 is turned off (operating in the cutoff mode) because the gate of the second NMOS 208 is coupled to the negative node 216.

Concurrently, during a high pulse of the clock signal CLK, the gate of the first NMOS 206, coupled to the positive node 214 is a higher voltage than the source of the NMOS, which is coupled to the negative node 216. Accordingly, the first NMOS 206 is turned on during a high clock pulse of the clock signal, CLK. Conversely, because the source of the second NMOS 208 is coupled to the positive node 214 and the gate of the second NMOS 208 is coupled to the negative node 216, the second NMOS 208 is turned off during a high clock pulse of the clock signal, CLK. Accordingly, the signal, $V_{IN}$, is passed through the first NMOS 206 to charge (e.g., pump) the second capacitor 212 coupled to the negative node 216 during a high clock pulse of the clock signal, CLK.

Upon the clock signal, CLK transitioning to a low state (about 0 V), the negative clock signal, nCLK provides a high clock pulse of about 6 V. In this situation, the negative clock signal, nCLK charges (pumps voltage) the negative node 216 via the second capacitor 212. Also, during a high clock pulse of the negative clock, nCLK, the negative node 216 has a higher voltage than the positive node 214. Accordingly, the first PMOS 202 (with a gate coupled to the positive node 214) is turned on and the second PMOS (with a gate coupled to the negative node 216) is turned off, such that the negative node 216 is coupled to the output signal, $V_{OUT}$ via the first PMOS 202. Therefore, in response to a high clock pulse of the negative clock signal, nCLK current stored in the second capacitor 212 drives the output signal, $V_{OUT\_}$ while the negative clock signal, nCLK continues to charge (pump) voltage into the negative node 216, thereby driving the output signal, $V_{OUT}$ to a voltage level higher than the input signal, $V_{IN}$.

Also, during a high clock pulse of the negative clock, nCLK, the first NMOS 206 is turned off because the gate of the first NMOS 206 is coupled to the positive node 214 and the second NMOS 208 is turned off because the gate of the second NMOS 208 is coupled to the negative node 216. Accordingly, during a high clock pulse of the negative clock, nCLK, the first capacitor 210 is charged by the input signal, $V_{IN}$. Upon the clock signal, CLK switching back to a high clock pulse, the negative clock signal, nCLK switches to a low state. Accordingly, the current in the second capacitor 212 charges the output signal, $V_{OUT}$ and the clock signal continues to charge (e.g., pump) about 6 V into the positive node 214, thereby driving the output signal, $V_{OUT}$ to a voltage level higher than the input signal, $V_{IN}$. Accordingly, at times when the clock signal, CLK is at a high pulse, or at a low state, the output signal $V_{OUT}$ is higher than the input signal, $V_{IN}$.

Referring again to FIG. 2, in at least one example the first charge pump stage 104 includes a bypass switch 108 connected between the input and outputs of the charge pump circuit 106. In at least one example, the bypass switch 108 is formed with an NMOS with a gate controlled by a complement of the turbo mode enable signal, nTURBO_EN, which is referred to as a negative turbo mode enable signal. Accordingly, in this example, if the negative turbo mode enable signal, nTURBO_EN is asserted as a high voltage (indicating that the multi-stage charge pump 100 is operating in steady state mode). In response, the NMOS is turned on, and the bypass switch 108 substantially short circuits the input and output of the first charge pump circuit 106 of the first charge pump stage 104. In situations where the negative turbo mode enable signal, nTURBO_EN is de-asserted as a low voltage signal, the NMOS of the bypass switch 108 is turned off, such that the input signal, $V_{IN}$ traverses the first charge pump circuit 106.

In at least one example, the first charge pump stage 104 generates the output signal, $V_{STG1}$. In at least one example, in the steady state mode, the output signal, $V_{STG1}$ is a signal nearly equal to the input signal, $V_{IN}$. As an example, in the steady state mode, where the input signal, $V_{IN}$ is about 6 V, the output signal of the first charge pump stage 104, $V_{STG1}$ is about 6 V. In the turbo mode, the output signal, $V_{STG1}$ is ramped up about 6 V greater than the input signal, $V_{IN}$, such that in the turbo mode, where the input voltage is about 5.5 V to about 6.5 V, the output signal, $V_{STG1}$ has a voltage in a range of about 11.5 V to 12.5 V.

The output signal of the first charge pump stage 104, $V_{STG1}$ feeds into a second charge pump stage 110 (labeled in FIG. 1 and "CHARGE PUMP STAGE 2"). In at least one example, the second charge pump stage 110 has another instance of the first charge pump circuit 111 that ramps up to adding (from about 0 V) up to about 4 V to $V_{STG1}$ in the turbo mode and adds about 6 V to $V_{STG1}$ in the steady state mode. The first charge pump circuit 111 of the second charge pump stage 110 is controlled with a clock signal, CLK and a complement (negative) clock signal, nCLK that is an inverted version of the clock signal, CLK. The clock signal, CLK has a lower frequency than the turbo clock signal, TCLK. In at least one example, the output of the first charge pump circuit 111 of the second stage charge pump 110 is fed to a filter 112 (e.g., a low pass filter) of the second charge pump stage 110. The filter 112 includes a polysilicon capacitor coupled to the output of the first charge pump circuit 111 of the second charge pump stage 110 and to an electrically neutral node (e.g., electrical ground node at or near 0 V). In this example, the filter 112 smooths the output of the first charge pump circuit 111 in the second charge pump stage 110.

In at least one example, the output of the second charge pump stage 110, $V_{STG2}$ feeds into a third charge pump stage 114 and into a level shifter 116. In this example, in the turbo mode, the output of the second charge pump stage 110, $V_{STG2}$ has a voltage level of about 13-14 V. In the steady state mode, the output of the second charge pump stage 110, $V_{STG2}$ has a voltage level of about 12-13 V because, in the steady state mode, the first charge pump circuit 54 of the first charge pump stage 52 is bypassed.

In at least one example, the third charge pump stage 114 includes yet another instance of the first charge pump circuit 115. In this example, the first charge pump circuit 115 of the third charge pump stage 104 ramps up to adding about 4 V to $V_{STG2}$ while the multi-stage charge pump 100 operates in the turbo mode. In another example, the first charge pump circuit 115 of the third charge pump stage 114 adds about 6 V to $V_{STG2}$ while the multi-stage charge pump 100 operates in the steady state mode. In at least one example, the output of the first charge pump circuit 115 of the third charge pump stage 114 feeds into a filter 118 (e.g., a low pass filter). The filter 118 includes a polysilicon capacitor coupled between the input signal, $V_{IN}$ to generate an output signal of the third charge pump stage 114, $V_{STG3}$. The output $V_{STG3}$ of the filter 118 is the output of the third charge pump stage 114, $V_{STG3}$.

In at least one example, the output of the third charge pump stage 114, $V_{STG3}$ is about 18 V in both the steady state mode and the turbo mode. Thus, in at least one example, by accounting for the start-up conditions the first charge pump circuits 106, 111 and 115 and controlling the bypass switch 108, the output of the third charge pump stage 64, $V_{STG3}$ is about equal (e.g., within 2 V) while the multi-stage charge pump 100 operates in either the turbo mode or the steady state mode. The output of the third charge pump stage 114 is provided to an input of the level shifter 116 and a fourth charge pump stage 120.

In at least one example, the level shifter 116 receive signals generated by a biasing circuit 117. In at least one example, the biasing circuit 117 is integrated with the level shifter 116 and in another example, the biasing circuit 117 and the level shifter 116 are discrete circuits. In at least one example, the biasing circuit receives a power signal, DVDD, a current source (CS) and a charge pump enable signal, CP_EN (e.g., a power-on signal). In this example, the biasing circuit 117 also receives an offset enable signal, OS_EN, which is the negative (complement) of the turbo enable signal TURBO_EN. In this example, the biasing circuit 117 is coupled to an electrical neutral node, (e.g., ground), GND, which is about 0 V. Moreover, the biasing circuit 117 also receives the input signal, $V_{IN}$, and the output of the first, second and third charge pump stages 104, 110 and 114, $V_{STG1}$, $V_{STG2}$ and $V_{STG3}$.

In at least one example, the biasing circuit 117 generates outputs that include an offset voltage VOS and bias levels VBLOCK1 and VBLOCK2 for the level shifter 116. In at least one example, as described herein, the offset voltage, VOS has voltage level of about 6 V in the steady state mode.

In at least one example, the level shifter 116 also receives the output of the second charge pump stage 110, $V_{STG2}$, the power signal DVDD and the power on signal, CP_EN. Further, in this example, the level shifter 116 also receives the turbo enable signal, TURBO_EN. In at least one example, the level shifter 116 also receives a shifter clock signal, SHIFTER_CLK. The shifter clock signal, SHIFT-ER_CLK has a predetermined frequency. In at least one example, the level shifter 116 is a circuit that generates a level clock signal, T2CLK and a negative (complement) level clock signal, nT2CLK with a frequency about equal to the frequency of the shifter clock, SHIFTER_CLK.

Moreover, the level clock signal, T2CLK and the negative level clock signal nLEV CLK, swings between the offset voltage, $V_{OS}$ and the output of the third charge pump stage, $V_{STG3}$ in the steady state mode and between the output of the third charge pump stage, $V_{STG3}$ and the electrically neutral node in in the turbo mode. Thus, in the turbo mode, the level clock, T2CLK swings between about 0 V and about 18 V. In the steady state mode, the clock signal, T2CLK swings between about 6 V and 18 V. In at least one example, the level shifter 116 outputs the level clock signal, T2CLK and the negative level clock signal, nT2CLK.

Figure 4:
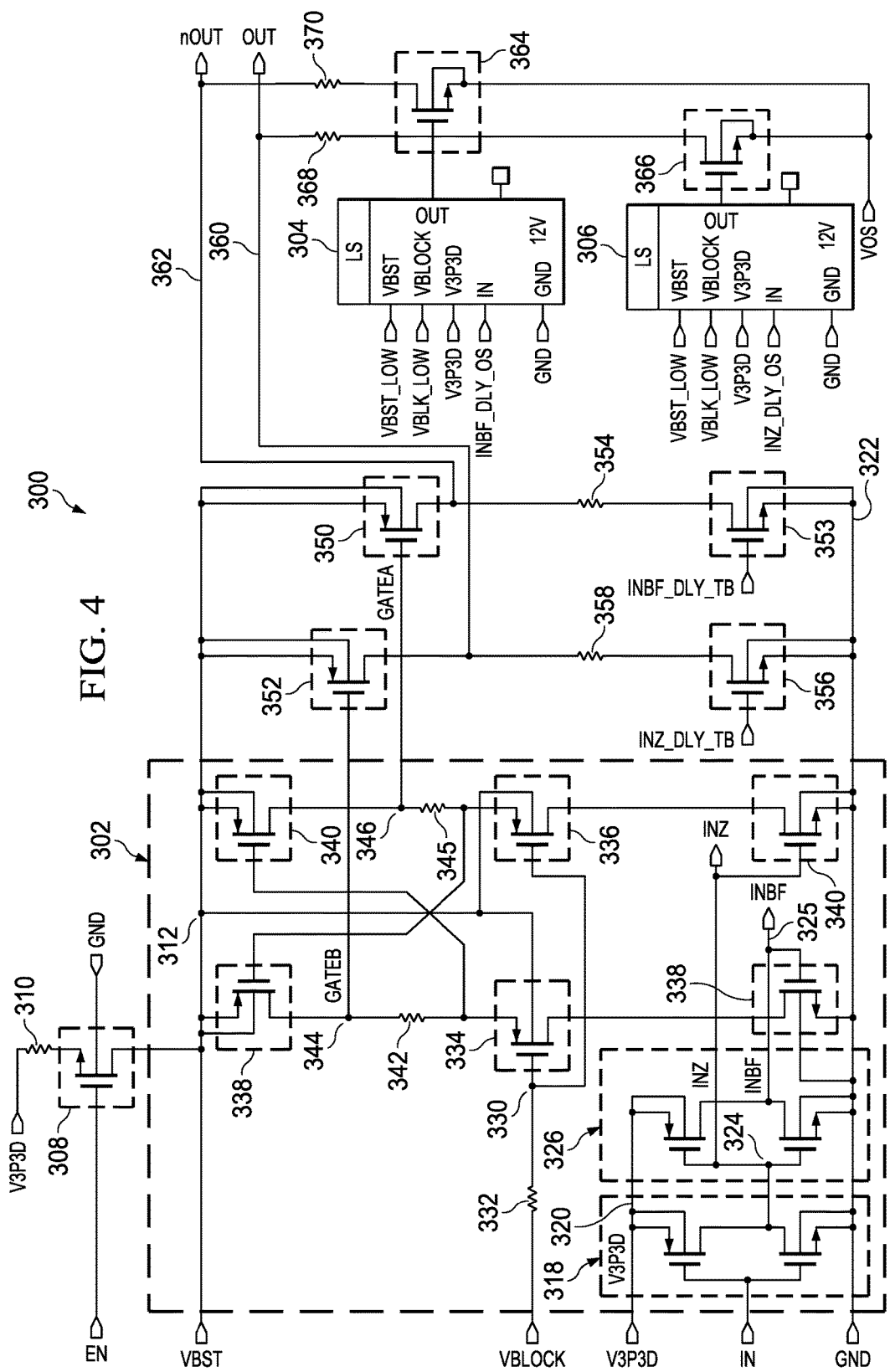
FIG. 4 is a circuit diagram of an example of a level shifter.
Figure 5:
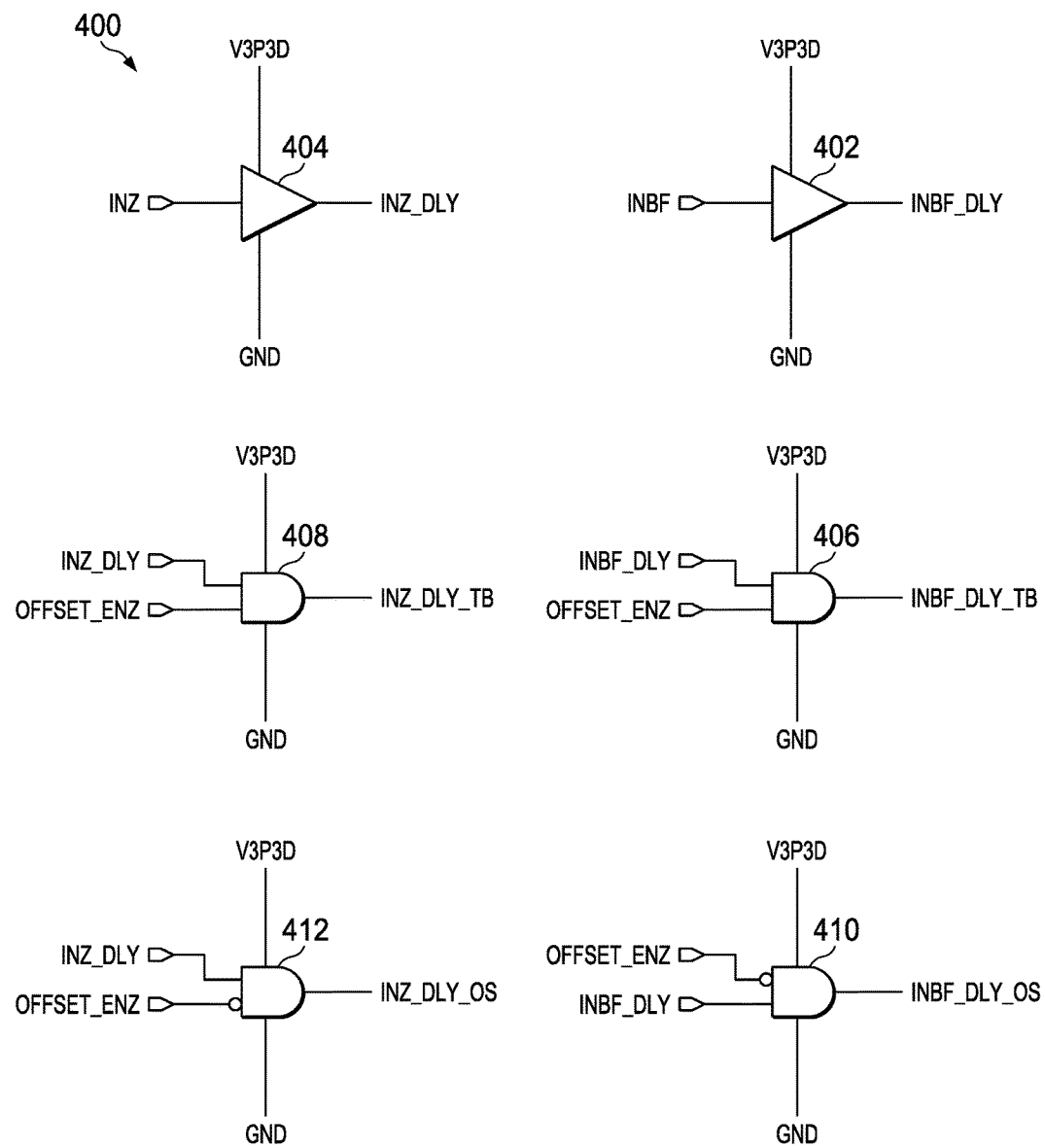
FIG. 5 is an example of logic for the level shifter of FIG. 4.
Figure 6:
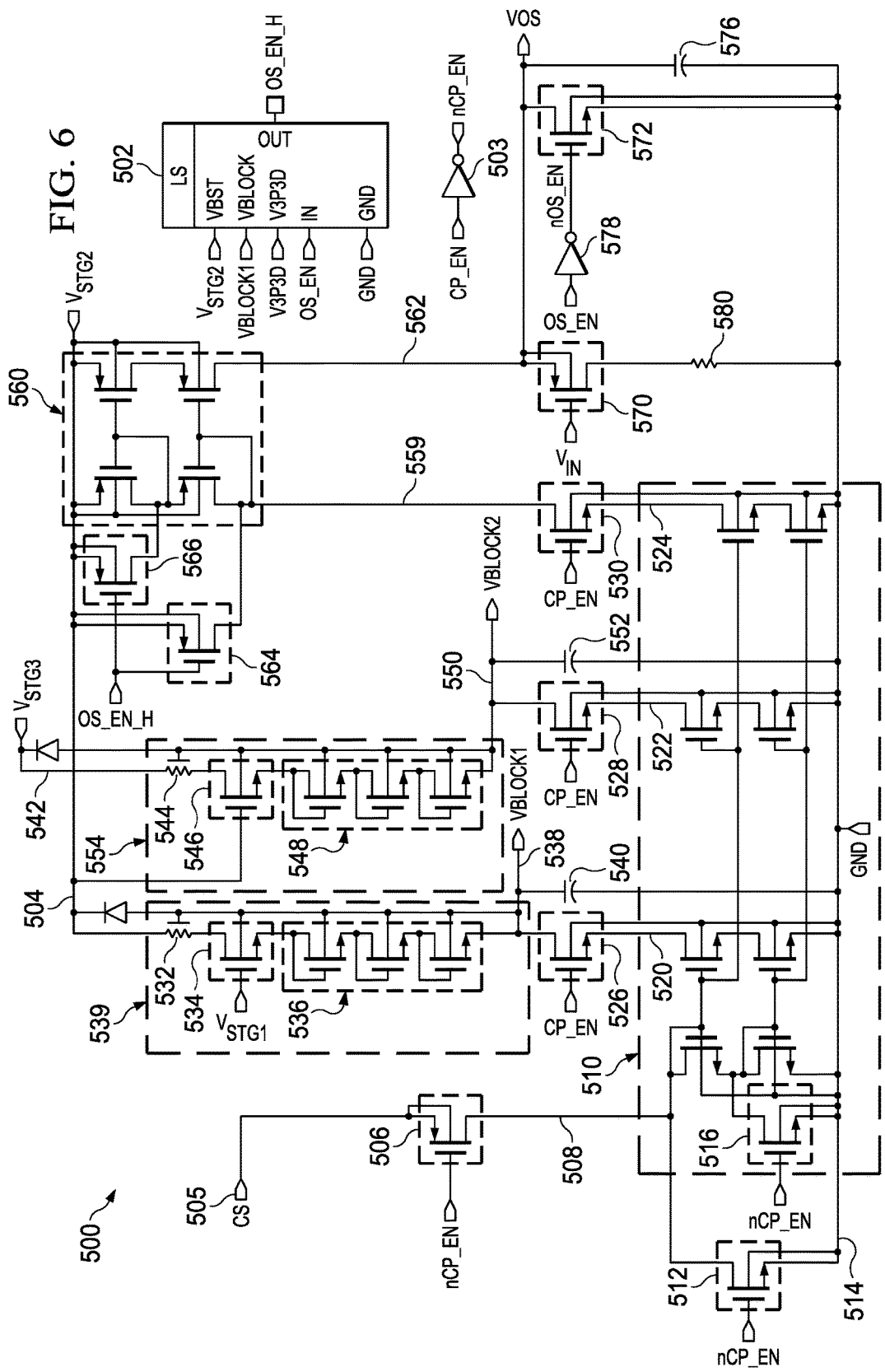
FIG. 6 is a circuit diagram of an example of a biasing circuit.

FIGS. 4 and 5 are circuit diagrams of an example level shifter 300 to implement the level shifter 116 of FIG. 2 or the level shifter 70 of FIG. 1. More particularly, FIG. 4 shows a circuit diagram of an example arrangement of a first level shifter circuit 302, a second level shifter circuit 304 and a third level shifter circuit 306 of the level shifter 300. In at least one example, the first level shifter circuit 302, the second level shifter circuit 304 and the third level shifter circuit 306 are alternatively referred to as sub-level shifters. FIG. 5 is a circuit diagram of a logic circuit 400 for the level shifter 300. Also, FIG. 6 shows a biasing circuit 500 for the level shifter 300. For clarity, the same reference numbers and descriptions are employed throughout FIGS. 4-6 to denote the same structure.

In at least one example, in FIG. 4, the first level shifter circuit 302, the second level shifter circuit 304 and the third level shifter circuit 306 have the same internal circuitry, with different input signals. Some of the input signals are provided from the logic circuit 400 and the biasing circuit 500. For clarity, the internal circuitry of the first level shifter circuit 302 is described in detail, and the second level shifter circuit 304 and the third level shifter circuit 306 are configured in a similar manner.

In at least one example, a low output impedance voltage, V3P3D is coupled to a source of an NMOS 308, via a resistor 310. In at least one example, the voltage level of V3P3D is about 3.0 V to about 3.5 V (e.g., often about 3.3 V). In this example, a gate of the NMOS 308 is coupled to an enable signal, EN. In at least one example, the enable signal, EN is a power-on signal that is active (e.g., logical '1') if power is applied to the level shifter 300. The enable signal, EN corresponds to the charge pump enable signal, CP_EN shown in FIG. 2. In at least one example, a drain of the NMOS 308 is coupled to a high voltage node 312 of the first level shifter circuit 302. In this example, the high voltage node 312 is also coupled to a high voltage rail signal, VBST of the level shifter 300. The high voltage rail signal, VBST corresponds to the output of the third charge pump stage, $V_{STG3}$ of FIG. 2.

In at least one example, an input signal, IN (corresponding to the shifter clock signal, SHIFTER_CLK of FIG. 1) is coupled to an input of a first CMOS inverter 318. In at least one example, the first CMOS inverter 318 has a high voltage node 320 coupled to the low impedance voltage V3P3D (e.g., about 3.3 V) and an electrically neutral node 322 of the first CMOS inverter 318 coupled to an electrically neutral node (e.g., ground, about 0 V). In at least one example, an output node 324 of the first CMOS inverter 318 provides a clock signal, INZ that is the inverse of the input signal, IN level shifted to a voltage of about V3P3D. Also, in at least one example, the output node 324 of the first CMOS inverter 318 is employed as an input node of a second CMOS inverter 326. In this example, the second CMOS inverter 326 is coupled to the high voltage node 320 and the electrically neutral node 322 of the first CMOS inverter 318. In at least one example, the second CMOS inverter 326 provides a buffered version of the input signal, IN namely a buffered clock signal, INBF at an output node 325, such that INZ is the complement (negative) of INBF, and INZ is referred to as the negative buffered clock signal.

In at least one example, the buffered clock signal, INBF and the negative buffered clock signal, INZ is applied to the logic circuit 400 shown in FIG. 5. The buffered clock signal, INBF is input into a delay (another buffer) 402 to generate a delayed buffered clock signal, INBF_DLY. Similarly, in at least one example, the negative buffered clock signal, INZ is input into a delay 404 to generate a delayed negative buffered clock signal, INZ_DLY.

In at least one example, the delayed buffered clock signal, INBF_DLY is provided to an input of an AND gate 406. In this example, the AND gate 406 also receives a negative offset enable signal, OFFSET ENZ at an input. The negative offset enable, OFFSET ENZ corresponds to the turbo enable, TURBO_EN signal shown in FIG. 2. In at least one example, the AND gate 406 outputs a delayed turbo clock signal, INBF_DLY_TB that oscillates between the voltage level V3P3D (e.g., about 3.3 V) and ground (e.g., about 0 V) if the level shifter 300 is operating in turbo mode, in which the negative offset enable signal, OFFSET_ENZ is asserted (e.g., a logical 1). Similarly, in at least one example, the negative delayed buffered clock signal, INZ_DLY is provided to an input of an AND gate 408. In this example, the AND gate 408 also receives the negative offset enable signal, OFFSET_ENZ at an input. In at least one example, the AND gate 408 outputs a delayed negative turbo clock signal, INZ_DLY_TB that oscillates between the voltage level V3P3D (e.g., about 3.3 V) and ground (e.g., about 0 V) if the level shifter 300 is operating in "not" turbo mode (steady state mode). In the steady state mode, the negative offset enable signal, OFFSET_ENZ is set at a logical '0'.

In at least one example, the negative offset enable signal, OFFSET ENZ is applied to an inverted input of an AND gate 410. In this example, the AND gate 410 also receives the delayed buffered clock signal, INBF_DLY an input. The AND gate 410 provides a delayed offset clock signal, INBF_DLY_OS that oscillates between the voltage level V3P3D (e.g., about 3.3 V) and ground (e.g., about 0 V) if the level shifter 300 is operating in steady state mode, which causes the negative offset enable signal, OFFSET_ENZ to be de-asserted (e.g., a logical 0). In at least one example, the negative offset enable signal, OFFSET_ENZ is applied to an inverted input of an AND gate 412. In this example, the AND gate 412 also receives the negative delayed buffered clock signal, INZ_DLY at an input. The AND gate 412 provides a negative delayed offset clock signal, INZ_DLY_OS that oscillates between the voltage level V3P3D (e.g., about 3.3 V) and an electrically neutral level (e.g., ground such as about 0 V) if the level shifter 300 is operating in steady state mode. This causes the negative offset enable signal, OFFSET_ENZ to be de-asserted (e.g., a logical '0').

The delayed turbo clock signal, INBF_DLY_TB and the negative delayed turbo clock signal, INZ_DLY_TB oscillate during turbo mode and are inverted versions of each other. Conversely, the delayed offset clock signal, INBF_DLY_OS and the negative delayed offset clock signal, INZ_DLY_OS oscillate during steady state mode and are also inverted versions of each other. Accordingly, the delayed turbo clock signal, INBF_DLY_TB and the negative delayed turbo clock signal, INZ_DLY_TB are substantially mutually exclusive with respect to the delayed offset clock signal, INBF_D-LY_OS and the negative delayed offset clock signal, INZ_DLY_OS.

As shown in FIGS. 2 and 4, the high rail voltage signal, VBST is driven by the output signal of the third charge pump stage 114, $V_{STG3}$. In at least one example, the high rail voltage, VBST is a signal of up to about 18 V with a relatively high output impedance. In this example, during an initial startup, the high rail voltage is less than about 1 V (ramping to 18 V). The voltage, V3P3D drives the high voltage node 312 to a voltage level of about V3P3D minus the threshold voltage ($V_T$) of the NMOS 308 (e.g., about 0.9 V). In an example where the voltage, V3P3D is about 3.3 V, the high voltage node 312 is driven up to a voltage level of about 2.4 V and the output impedance at the high voltage node 312 is lowered. Moreover, as VBST increases, the high rail voltage, VBST ramps up to about 18 V.

In at least one example, a low rail voltage, VBLOCK is coupled to a low voltage node 330 via a resistor 332. In at least one example, the low voltage rail, VBLOCK is provided from the biasing circuit 500 and corresponds to a second output VBLOCK2 of the biasing circuit (as shown in FIG. 2). The low voltage node 330 is coupled to a gate of a PMOS 334 and a gate of a PMOS 336. A drain of the PMOS 334 is coupled to a drain of an NMOS 338. A gate of the NMOS 338 is coupled to the output of the second CMOS inverter 326, the buffered clock signal, INBF. A source of the NMOS 338 is coupled to the electrically neutral node 322. A drain of the PMOS 336 is coupled to a drain of an NMOS 340. A gate of the NMOS 340 is coupled to the output node 324 of the first CMOS inverter 318, the negative buffered clock signal, INZ. In this example, a source of the NMOS 340 is coupled to the electrically neutral node 322.

In at least one example, the high rail voltage signal, VBST is applied to a source of a PMOS 338 and to a source of a PMOS 340. A drain of the PMOS 338 is coupled to a source of the PMOS 334 via a resistor 342. A drain of the PMOS 340 is coupled to a source of the PMOS 336 via a resistor 345. In at least one example, a gate of the PMOS 338 is coupled to the source of the PMOS 336 and a gate of the PMOS 340 is coupled to the source of the PMOS 334. The drain of the PMOS 340 is coupled to a node 346, which is referred to as GATEA. The drain of the PMOS 338 is coupled to a node 348, which is referred to as GATEB. In at least one example, the node 346, GATEA is coupled to a gate of a PMOS 350 and the node 348, GATEB is coupled to a gate of a PMOS 352. A source of the PMOS 350 and a source of the PMOS 352 is coupled to the high voltage node 312.

In operation, the voltage at the node 346, GATEA swings between a voltage of about the voltage of the high voltage rail, VBST and a voltage of about the low rail voltage, VBLOCK at a frequency dictated by the input signal, IN. Similarly, the voltage at node 344, GATEB is the negative (complement) of the voltage of the node at 345, GATEA. The low voltage rail, VBLOCK is provided from the biasing circuit 500 (as VBLOCK2, as shown in FIG. 2). The node 346, GATEA and the node 344, GATEB correspond to output signals (are inverted versions of each other) of the first level shifter circuit 302.

FIG. 6 is a circuit diagram of the biasing circuit 500. The biasing circuit 500 includes a level shifter 502 that employed with circuitry similar to the first level shifter circuit 302 of FIG. 4. In at least one example, the biasing circuit 500 receives the output of the second charge pump stage 110, $V_{STG2}$ (shown in FIG. 2) at a node 504 (e.g., a high voltage rail). Also, in this example, a current source (CS), 505 provides a direct current (e.g., about 40 nanoamperes (nA)) into a source of a PMOS 506. In at least one example, the charge pump enable signal, CP_EN is input into a NOT gate 503 to generate a negative charge pump enable, signal, nCP_EN. The charge pump enable, signal, CN_EN is high (e.g., logical '1') if the multi-stage charge pump 100 of FIG. 2 is enabled. The charge pump enable signal, CP_EN is low (e.g., a logical '0') if the multi-stage charge pump 100 is not enabled. The negative charge pump enable signal, nCP_EN is low (e.g., logical '0') if the multi-stage charge pump 100 of FIG. 2 is enabled and the negative charge pump enable signal, nCP_EN and is high (e.g., a logical '1') if the multi-stage charge pump 100 is not enabled.

In at least one example, a gate of the PMOS 506 is coupled to the negative charge pump enable signal, nCP_EN. Thus, in turbo mode or steady state mode operation of the multi-stage charge pump 100, the PMOS 506 is turned on (e.g., saturation mode). A drain of the PMOS 506 is a reference current node 508 for a (telescopic) cascode current mirror 510. In at least one example, the reference current node 508 is coupled to a drain of an NMOS 512. In at least one example, a gate of the NMOS 512 is coupled to the negative charge pump enable signal, nCP_EN. In at least one example, a source of the NMOS 512 is coupled to an electrically neutral node 514 (e.g., about 0 V and/or ground, demonstrated as GND). Also, in at least one example, a drain of an NMOS 516 is coupled to a second stage of the cascode current mirror 510. A source of the NMOS 516 is coupled to the electrically neutral node 514 and a gate of the NMOS 516 is coupled to the negative charge pump enable signal, nCP_EN.

In at least one example, the cascode current mirror 510 has output nodes 520, 522 and 524. The output node 520 is coupled to a source of an NMOS 526, the output node 522 is coupled to a source of an NMOS 528 and the output node 522 is coupled to a source of an NMOS 530. A gate of the NMOSs 526, 528 and 530 are each coupled to the charge pump enable signal, CP_EN.

In operation, if the charge pump is not enabled, such that the negative charge pump signal, nCP_EN is high (e.g., logical '1') current through the reference current node 508 flows to the electrically neutral node 514. Also, if the charge pump is not enabled, the charge pump enable signal, CP_EN is low (e.g., logical '0') and the NMOSs 526, 528 and 530 are turned off, thereby preventing current from flowing on the output nodes 520, 522 and 524 of the cascode current mirror 510. Conversely, if the charge pump is enabled, such that the negative charge pump enable signal, nCP_EN is low (e.g., logical '0') and the charge pump enable signal, CP_EN is high (e.g., logical '1'), the cascode current mirror 510 is activated.

In situations that the cascode current mirror 510 is activated, the cascode current mirror 510 induces a current at the output nodes 520, 522 and 524 of the cascode current mirror 510. Current at the output nodes 520, 522 and 524 is proportional to the current at the current reference node 508. In at least one example, transistor devices in the cascode current mirror 510 is sized such that the current at the output nodes 520 and 522 is about one-fourth (¼) of the current at the reference current node 508. Also, in at least one example, the transistor devices in the cascode current mirror 510 is sized such that the current at the output node 524 has a predetermined relationship (e.g., about one-half (½)) of the current at the reference current node. Therefore, in examples where a current at the reference current node 508 is about 40 nA, the current at the output nodes 520 and 522 is about 10 nA and the current at the output node 524 is about 20 nA. However, in at least one other example, the transistor devices are sized differently such that the current at the output nodes 520, 522 and 524 are set to a desired level.

In at least one example, the node 504 (coupled to the output of the second charge pump stage 110, $V_{STG2}$) is coupled, via a resistor 532, to a drain of an NMOS 534. A gate of the NMOS 534 is coupled to an output of the first charge pump stage 104, $V_{STG1}$. In at least one example, the NMOS 534 is configured as a source follower. A source of the NMOS 534 is coupled to a series 536 of diode-connected NMOSs. In this example, the series 536 has three (3) diode connected NMOSs. In at least one other example, the series 536 has more or fewer NMOSs. In at least one example, a source of a last NMOS in the series 536 is coupled to a drain of the NMOS 526 at a node 538. In at least one example, the node 538 is coupled to the electrically neutral node 514 via a capacitor 540, which is a polysilicon capacitor. In this example, a first output signal of the biasing circuit 500, VBLOCK1 is provided from the node 538.

In at least one example, components within a box 539, including the series 536, the NMOS 534, and the resistor 532 is formed in the same isolated well of an IC chip. By forming (fabricating) the components in the box 539 in the same isolated well, space efficiency on a die is achievable relative to forming the components in multiple wells.

In situations where the charge pump signal, CP_EN is high (e.g., logical 1), each NMOS in the series 536 and the NMOS 534 operate in weak inversion mode, due to a relatively low current induced at the output node 520 of the cascode current mirror 510. Accordingly, in at least one example, the first output signal, VBLOCK1 is about 400-500 millivolts (mV) per transistor diode drop less than the output of the first charge pump stage 104, $V_{STG1}$. In an example where the output of the first charge pump stage 104, $V_{STG1}$ is about 6 V, the first output of the biasing circuit 500, VBLOCK1 is about 1.6-2 V less than the output of the first charge pump stage 104, $V_{STG1}$ (e.g., about 4 V to about 4.6 V).

In at least one example, a node 542 is coupled to an output of the third charge pump stage 114, $V_{STG3}$. The node 542 is coupled, via a resistor 544, to a drain of an NMOS 546. A gate of the NMOS 546 is coupled to the node 504 (coupled to the output of the second charge pump stage 110, $V_{STG2}$). Thus, the NMOS 546 is configured as a source follower. A source of the NMOS 546 is coupled to a series 548 of diode-connected NMOSs. In this example, the series 548 has three (3) diode connected NMOSs. In at least one other example, the series 548 has more or fewer NMOSs. A source of a last NMOS in the series 548 is coupled to a drain of the NMOS 528 at a node 550. The node 550 is also coupled to the electrically neutral node 514 via a capacitor 552, which capacitor 552 is a polysilicon capacitor. A second output signal, VBLOCK2 is provided from the node 550.

In at least one example, circuit components within a box 554, including the series 548, the NMOS 546, and the resistor 544 is formed in the same isolated well of an IC chip. By forming (fabricating) the components in the box 554 in the same well, space efficiency on a die is achievable relative to forming the components in multiple wells.

In situations where the charge pump signal, CP_EN is high (e.g., logical 1), each NMOS in the series 548 and the NMOS 546 operate in weak inversion mode, due to a relatively low current induced at the output node 522 of the cascode current mirror 510. Accordingly, in at least one example, the second output signal, VBLOCK2 is about 400-500 mV per transistor diode drop less than the output of the second charge pump stage 110, $V_{STG2}$. In an example where the output of the second charge pump stage 110, $V_{STG2}$ is about 12 V, the second output signal VBLOCK2 is about 1.6 V to about 2 V less than the output of the second charge pump stage 110, $V_{STG2}$ (e.g., about 10 V to about 10.4 V).

In at least one example, the level shifter 502 receives the output of the second charge pump stage 110, $V_{STG2}$, and the first output signal, VBLOCK1. The level shifter 502 receives the offset enable signal, OS_EN. Also, in this example, the level shifter 502 is coupled to the voltage level V3P3D (e.g. about 3.3 V) and to ground, GND. The level shifter 502 shifts the offset enable signal, OS_EN (a signal that is about 3 V in the steady state mode) to a shifted offset enable signal, OS_EN_H that has a voltage within the range between the output of the second charge pump stage 110, $V_{STG2}$ and the first output signal, VBLOCK1. Accordingly, the shifted offset enable signal, OS_EN_H (if OS_EN is high), is presumed to be about 12 V. Moreover, if the offset enable signal is low (logical '0'), indicating that the multi-stage charge pump 100 is operating in turbo mode, the shifted offset enable signal, OS_EN_H is about 0 V.

In at least one example, a drain of the NMOS 530 is coupled to a reference current node 559 of a cascode current mirror 560. The source of the NMOS 530 is coupled to an output node 524 of the cascode current mirror 510. The cascode current mirror 560 has an output node 562. In at least one example, the shifted offset enable signal, OS_EN_H is coupled to a gate of a PMOS 564 and a gate of a PMOS 566. A source of the PMOS 564 and a source of the PMOS 566 are coupled to the node 504. A drain of the PMOS 564 and a drain of the PMOS 566 are coupled to transistor devices in the cascode current mirror 560. In operation, in an example where the shifted offset enable signal, OS_EN_H is low (about 0 V, indicating that the multi-stage charge pump 100 is operating in turbo mode) the cascode current mirror 560 is disabled. In an example where the shifted offset enable signal, OS_EN_H is high (about 12 V, indicating that the multi-stage charge pump 100 is operating in steady state mode) the cascode current mirror 560 is activated.

Upon activation, in at least one example, a current is induced on the output node 562 based on a current at the current reference node 559. The current at the output node 562 of the cascode current mirror 560 is proportional to the current at the current reference node 559 and varies based on a size of transistor devices employed in the cascode current mirror 560. In at least one example, the current induced at the output node 562 is about equal to the current at the current reference node 559. Thus, in situations where the current at the current reference node is about 20 nA, the current at the output node 562 of the cascode current mirror 560 is about 20 nA.

In at least one example, the output node 562 is coupled to a source of a PMOS 570 and a source of an NMOS 572. In at least one example, the output node 562 is coupled to a capacitor 576 (a polysilicon capacitor) that is coupled to the electrically neutral node 514. In this example, the output node 562 provides an offset voltage, VOS that is another (third) output signal of the biasing circuit 500.

In at least one example, a gate of the PMOS 570 is coupled to the output of the input signal, $V_{IN}$ (which corresponds to the input signal, $V_{IN}$ of the multi-stage charge pump 100 of FIG. 2). The PMOS 570 is configured as a source follower, such that the source of the PMOS 570 is nearly equal to the input signal, $V_{IN}$. Moreover, the offset enable signal, OS_EN is applied to an input of an inverter 578. An output of the inverter 578 generates a negative (complement) offset enable signal, nOS_EN that is applied to a gate of the NMOS 572. A drain of the PMOS 570 is coupled to the electrical neutral node 514 via a resistor 580.

In operation, in situations where the offset enable signal, OS_EN is low (logical '0', such as in turbo mode), the NMOS 572 is turned on (saturation mode), causing the offset voltage, VOS to drop to near 0 V. In situations where the offset enable signal, OS_EN is high (logical '1', in steady state mode), the NMOS 572 is turned off (cutoff mode). In situations where the NMOS 572 is turned off and the input signal, $V_{IN}$ is about 5.5-6 V (in steady state mode), the voltage at the output node 562, controlled by the PMOS 570, is about 400-500 mV greater than the input signal, $V_{IN}$. In this example, the offset voltage, VOS is about 5.9 V to about 6.5 V.

Referring again to FIG. 4, in at least one example, a drain of the PMOS 350 is coupled to a drain of an NMOS 353 via a resistor 354. A drain of the NMOS 353 is coupled to a drain of an NMOS 356 via a resistor 358. A source of the NMOS 353 and a source of the NMOS 356 are coupled to the electrically neutral node 322. A gate of the NMOS 353 is coupled to the delayed turbo clock signal, INBF_DLY_TB and the gate of the NMOS 356 is coupled to the negative delayed turbo clock signal, INZ_DLY_TB. The delayed turbo clock signal, INBF_DLY_TB and the negative delayed turbo clock signal, INZ_DLY_TB each oscillate (as inverted versions of each other) between the voltage level V3P3D (e.g., about 3.3 V) and ground (e.g., about 0 V) if the level shifter 300 is operating in turbo mode.

In at least one example, an output node 360 of the level shifter 300 is coupled to a drain of the PMOS 352, and provide an output signal, OUT. In this example, a negative (complement) output node 362 of the level shifter 300 is coupled to a drain of the PMOS 350. The negative output node 362 provides a negative (complement) output signal, nOUT that is an inverted version of the output signal, OUT.

In at least one example, the second level shifter circuit 304 and the third level shifter circuit 306 each receive the low boost voltage rail signal, VBST_LOW, which corresponds to the output of the second charge pump stage 110, $V_{STG2}$ (shown in FIG. 2). The second level shifter circuit 304 and the third level shifter circuit 306 also receives the low-lower voltage rail, VBLK_LOW, which corresponds to the first output of the biasing circuit 500, VBLOCK1. Also, in this example, the second level shifter circuit 304 and the third level shifter circuit 306 each receive the low impedance voltage signal, V3P3D and be coupled to the electrically neutral node (GND). Moreover, in this example, the second level shifter circuit 304 receives the delayed offset clock signal, INBF_DLY_OS. Also, in at least one example, the third level shifter circuit 306 receives the negative delayed offset clock signal, INZ_DLY_OS. The delayed offset clock signal, INBF_DLY_OS and the negative delayed offset clock signal, INZ_DLY_OS oscillate (as complements of each other) between the voltage level V3P3D (e.g., about 3.3 V) and an electrically neutral level (e.g., ground such as about 0 V) if the level shifter 300 is operating in steady state mode.

In at least one example, an output of the second level shifter circuit 304 is coupled to a gate of an NMOS 364. In this example, an output of the third level shifter circuit 306 is coupled to a gate of an NMOS 366. A source of the NMOS 364 and a source of the NMOS 366 is coupled to the offset voltage, VOS (provided from the biasing circuit 500). A drain of the NMOS 366 is coupled (via a resistor 368) to the output node 360 and a drain of the NMOS 364 is coupled (via a resistor 370) to the negative output node 362.

During turbo mode operation of the level shifter 300, the NMOS 352 is switched on and off by the delayed turbo clock signal, INBF_DLY_TB and the NMOS 356 is switched on and off by the negative delayed turbo clock signal, INZ_D-LY_TB. Moreover, in turbo mode, the delayed offset clock signal, INBF_DLY_OS and the negative delayed offset clock signal, INZ_DLY_OS are de-asserted as low signals (e.g., logical '0'). This causes the output of the second level shifter circuit 304 and the third level shifter circuit 306 to be a low signal (e.g., near 0 V), such that the NMOS 364 and the NMOS 366 are switched off. Accordingly, in turbo mode, the output node 360, that provides the output signal, OUT is coupled to the drain of the PMOS 350. Similarly, in turbo mode, the negative output node 362, that provides the negative output signal, nOUT is coupled to the drain of the PMOS 352.

In the turbo mode of operation, due to the switching of the NMOS 352, the output node 360 and the output signal, OUT, swings between a voltage of about VBST (e.g., about 18 V) and an electrically neutral level (e.g., ground and/or about 0 V). The frequency of the output signal, OUT corresponds to the frequency of the input signal, IN of the first level shifter circuit 302. The input signal IN of the first level shifter circuit 302 corresponds to the shifter clock, SHIFTER_CLK shown in FIG. 2). Also, in the turbo mode operation, due to the switching of the NMOS 356, the negative output node 362 and the negative output signal, nOUT, also swings between a voltage of about VBST (e.g., about 18 V) and the electrically neutral level (e.g., about 0 V). The negative output signal, nOUT is an inverted version of the output signal, OUT.

In the steady state mode of operation, the NMOS 352 and the NMOS 356 are turned off (e.g., cutoff mode). Moreover, in the steady state mode, the NMOS 366 and the NMOS 364 are each turned on and off (as inverted versions of each other) by the second level shifter circuit 304 and the third level shifter circuit 306, respectively. Thus, in the steady state mode of operation, the output node 360 that provides the output signal, OUT swings between about a voltage level of the high voltage rail signal, VBST (e.g., about 18 V) and the offset voltage, VOS (e.g., about 6 V in the steady state mode).

Accordingly, in the turbo mode of operation, the level shifter 300 provides the output signal, OUT and the negative output signal nOUT that swing (as inverted versions of each other) from a voltage of about the high voltage rail signal, VBST (e.g., about 18 V) to an electrically neutral node (e.g., about 0 V). Also, in the steady state mode of operation, the level shifter 300 provides the output signal, OUT and the negative output signal, nOUT that swing (as inverted versions of each other) from a voltage of the high voltage rail signal, VBST (e.g., about 18 V) to about the offset voltage, VOS.

Referring again to FIG. 2, the level clock, T2CLK and the negative level clock signal, nT2CLK (as inverted versions of each other) are provided to the fourth charge pump stage 120. In at least one example, the fourth charge pump stage 120 includes a second charge pump circuit 126. In this example, the second charge pump circuit 126 receives the level clock signal, T2CLK and the negative level clock signal, nT2CLK. The second charge pump circuit 126 also receives the output of the third charge pump stage 114, $V_{STG3}$ as an input signal. The second charge pump circuit 126 of the fourth charge pump stage 120 is a circuit with polysilicon capacitors to boost the output of the third charge pump stage 114, $V_{STG3}$ by about 10-12 V to generate an output signal, $V_{STG4}$ for the fourth charge pump stage 120.

Figure 7:
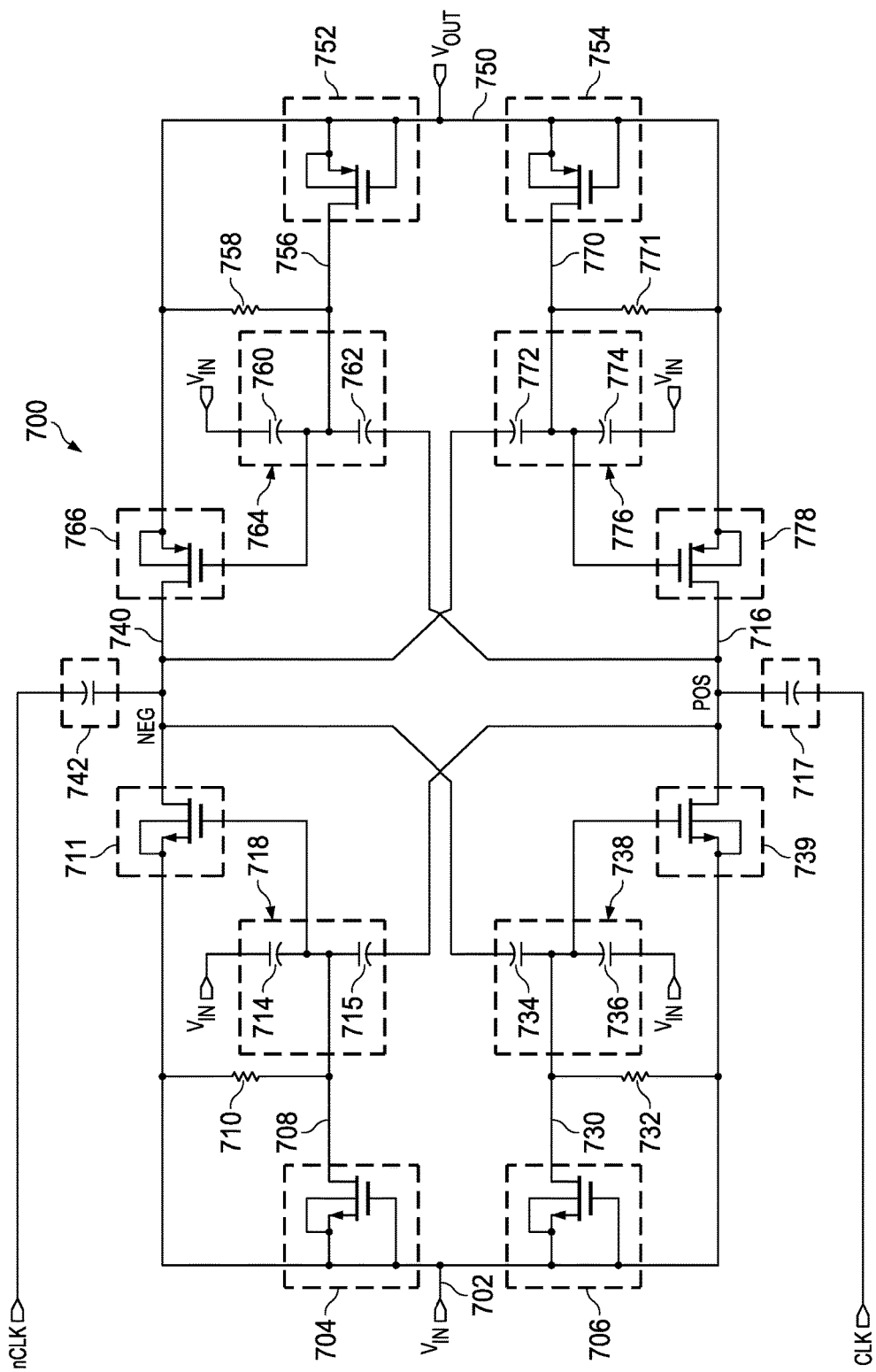
FIG. 7 is a circuit diagram of an example of a second charge pump circuit.

FIG. 7 is a circuit diagram of an example second charge pump circuit 700 that, in at least one example, is the second charge pump circuit 126 for the fourth charge pump stage 120 of FIG. 2 or circuit 82 of FIG. 1. In at least one example, an input node 702 receives an input signal, $V_{IN}$ that (as shown in FIG. 2) corresponds to the output of the third charge pump stage 114, $V_{STG3}$. The input node 702 is coupled to a source and a gate of NMOSs 704 and 706. Thus, the NMOSs 704 and 706 are turned off (cut-off mode). A drain of the NMOS 704 is coupled to a positive input biasing node 708. The positive input biasing node 708 is coupled to a biasing resistor 710 and a gate of an NMOS 711. The biasing resistor 710 is also coupled to the input node 702.

In at least one example, the positive input biasing node 708 is coupled between a capacitor 714 and a capacitor 715 of a reactance voltage divider 718, which is alternatively referred to as a reactance divider or a capacitive voltage divider. The capacitor 714 is also coupled to the input signal, $V_{IN}$. Moreover, in this example the capacitor 715 is coupled to a positive node 716 of the second charge pump circuit 700 (labeled in FIG. 7 as "POS"). The positive node 716 is coupled via a capacitor 717 to a clock signal, CLK. The clock signal, CLK corresponds to the level clock signal, T2CLK of FIG. 2.

In at least one example, a drain of the NMOS 706 is coupled to a negative input biasing node 730. In this example, the negative input biasing node 730 is coupled to a biasing resistor 732. The negative input biasing node 730 is coupled between a capacitor 734 and a capacitor 736 of a reactance voltage divider 738. In at least one example, the capacitor 736 is coupled to the input signal, $V_{IN}$. Moreover, in at least one example, the capacitor 734 is coupled to a negative node 740 of the second charge pump circuit 700 (labeled in FIG. 7 as "NEG"). The negative node 740 is coupled via a capacitor 742 to a negative clock signal, nCLK. The negative clock signal, nCLK corresponds to the negative level clock signal, nT2CLK of FIGS. 1 and 2, such that the clock signal, CLK and the negative clock signal, nCLK are inverted versions of each other. The negative input biasing node 730 is also coupled to a gate of an NMOS 739.

In at least one example, a drain of the NMOS 711 is coupled to the negative node 740 and a source of the NMOS 711 is coupled to the input node 702. In this example, a drain of the NMOS 739 is coupled to the positive node 716 and a source of the NMOS 739 is coupled to the input node 702.

In at least one example, an output node 750 is coupled to a gate and a source of PMOSs 752 and 754. The output node 750 provides an output signal, $V_{OUT}$ for the second charge pump circuit 700 (shown as $V_{STG4}$ in FIG. 2). Moreover, as configured the PMOSs 752 and 754 are turned on (e.g., saturation mode). A drain of the PMOS 752 is coupled to a positive output biasing node 756. The positive output biasing node 756 is coupled to a biasing resistor 758 that is also coupled to the output node 750. The positive output biasing node 756 is also coupled between a capacitor 760 and a capacitor 762 of a reactance voltage divider 764. IN this example, the capacitor 760 is coupled to the input signal, $V_{IN}$ and the capacitor 762 is also coupled to the positive node 716. Moreover, the positive output biasing node 756 is coupled to a gate of a PMOS 766. A source of the PMOS 766 is coupled to the output node 750 and a drain of the PMOS 766 is coupled to the negative node 740.

In at least one example, a drain of the PMOS 754 is coupled to a negative output biasing node 770. The negative output biasing node 770 is coupled between a capacitor 772 and a capacitor 774 of a reactance voltage divider 776. The capacitor 774 is also coupled to the input signal, $V_{IN}$. Moreover, the capacitor 762 is coupled to the negative node 740 of the second charge pump circuit 700. Also, the negative output biasing node 770 is coupled to a gate of a PMOS 778. In this example, a source of the PMOS 778 is coupled to the output node 750 and a drain of the PMOS 778 is coupled to the positive node 716.

The second charge pump circuit 700 generates the output signal, $V_{OUT}$ (corresponding $V_{STG4}$ in FIGS. 1 and 2). In one example operation, the input signal, $V_{IN}$ (corresponding to the output of the third charge pump stage 114, $V_{STG3}$ of FIG. 2 or output of charge pump stage 64 of FIG. 1) is about 18 V. As an example, equation 1 defines an example a relationship between $V_{OUT}$ and $V_{IN}$ for the second charge pump circuit 700.

$$V_{OUT} \approx V_{IN} + 11\ V \mp 1\ V \qquad \text{Equation 1}$$

In example operation, the clock signal, CLK swings between about 0 V and about 18 V in turbo mode and between about 6 V and 18 V in steady state mode at a controlled frequency (dictated by an external circuit). During a high clock pulse of the clock signal, CLK (at which CLK is about 18 V), the negative clock signal, nCLK is about 0 V in turbo mode and 6 V in steady state mode. Thus, during a high clock pulse of the clock signal, CLK, (via the capacitor 717) the positive node 716 is charged (e.g., "pumped voltage") by the clock signal, CLK. Also, a voltage across the biasing resistor 710 sets a biasing point for the positive input biasing node 708.

During the high clock pulse of the clock signal, CLK, the positive node 716 induces a voltage across the reactance voltage divider 718 that drives the positive input biasing node 708 to a voltage between the voltage of the positive node 716 and the voltage of the input signal, $V_{IN}$. For example, when the voltage at the positive input biasing node 708 exceeds the input voltage (coupled to the source of the NMOS 711), the NMOS 711 is turned on (e.g., saturation mode).

Conversely, operating in a similar manner, during a high clock pulse of the clock signal, CLK, the negative clock signal, nCLK is about 0 V in turbo mode or about 6 V in steady state mode. Accordingly, the negative input biasing node 730 coupled to the gate of the NMOS 739 drops to a voltage below the input signal, $V_{IN}$. Accordingly, the NMOS 739 is turned off (cutoff mode) because the source of the NMOS 739 is coupled to the input signal, $V_{IN}$.

The biasing resistor 771 biases the negative output biasing node 770. Thus, during the high clock pulse of the clock signal, CLK, the negative clock signal, nCLK is about 0 V, such that the negative node 740 voltage drops, thereby driving the negative output biasing node 770 to a voltage below the output voltage (coupled to the source of the PMOS 778). Accordingly, the PMOS 778 turns on (saturation mode). Conversely, in a similar manner, during a high clock pulse of the clock signal, CLK, the PMOS 766 is turned off (operating in the cutoff mode) because the gate of the PMOS 766 is coupled to the positive output biasing node 756. Accordingly, during a high clock pulse of the clock signal, CLK, the input signal, $V_{IN}$, is passed through the NMOS 711 to charge (e.g., pump) the capacitor 742 coupled to the negative node 740.

Upon the clock signal, CLK transitioning to a low state (e.g., about 0 V in the turbo mode or about 6 V in the steady state mode), the negative clock signal, nCLK transitions to a high state (e.g., about 18 V). In this situation, the state of some transistor devices is reversed. Accordingly, during a high clock pulse of the negative clock signal, nCLK, the NMOS 711 is turned off, and the NMOS 739 is turned on. Similarly, during a high clock pulse of the negative clock signal, nCLK, the PMOS 778 is turned off and the PMOS 766 is turned on. Accordingly, during a high clock pulse of the negative clock signal, nCLK current stored in the capacitor 742 drives the output signal, $V_{OUT}$ while the negative clock signal, nCLK charges (pumps) voltage into the negative node 216, thereby driving the output signal, $V_{OUT}$ to a voltage level higher than the input signal, $V_{IN}$ (about 10-12 V higher). Also, during a high clock pulse of the negative clock signal, nCLK, the negative node 740 is charged by the negative clock signal, nCLK via the capacitor 742.

Also, during a high clock pulse of the negative clock signal, nCLK, the NMOS 711 is turned off because the gate of the NMOS 711 is coupled to the positive input biasing node 708 and the NMOS 739 is turned on because the gate of the NMOS 739 is coupled to the negative input biasing node 730. Accordingly, during a high clock pulse of the negative clock, nCLK, the capacitor 717 is charged by the input signal, $V_{IN}$. Upon the clock signal, CLK switching back to a high clock pulse, the negative clock signal, nCLK switches to a low state. Accordingly, the current in the capacitor 717 charges the output signal, $V_{OUT}$ and the clock signal, CLK continues to charge (e.g., pump) into the positive node 716, thereby driving the positive node 716 to a voltage level higher than the input signal, $V_{IN}$ (e.g., about 10-12 V higher). Accordingly, at times when the clock signal, CLK is at a high pulse, or at a low state, the output signal $V_{OUT}$ is about 10-12 V higher than $V_{IN}$. Accordingly, in an example where the input signal $V_{IN}$ (corresponding to the output of the third charge pump stage 114, $V_{STG3}$) is about 18 V, the output signal $V_{OUT}$ (corresponding to the output of the fourth charge pump stage 120, $V_{STG4}$) is about 28-30 V, which varies based on power conversion efficiency.

By selecting capacitance ratios at the reactance voltage dividers 718, 738, 764 and 776, respective gate to source voltages for the NMOSs 711 and 739 and for the PMOSs 766 and 778 are kept to a voltage level below a predetermined acceptable limit (e.g., about 7 V). Thus, in one example, by implementing the reactance voltage dividers 718, 738, 764 and 776, IC chip compatible transistor devices are employed.

Moreover, the capacitors 714, 715, 734, 736, 760, 762, 772, 774, 717 and 742 of the second charge pump circuit 700, are exposed to voltage swings (drops) of up to about 18 V during operation in the turbo mode, which has a predetermined duty cycle (e.g., about 1% or less). During operation in the steady state mode (with a predetermined duty cycle of 99% or more), the capacitors 714, 715, 734, 736, 760, 762, 772, 774, 717 and 742 are exposed to voltage swings of up to about 12 V because, in the steady state mode, the clock signal, CLK and the negative clock signal, nCLK swing between about 6 V and 18 V. Accordingly, in at least one example, the capacitors 714, 715, 734, 736, 760, 762, 772, 774, 717 and 742 are formed as relatively small and power efficient polysilicon capacitors.

Referring again to FIG. 2, the second charge pump circuit 126 generates an output signal, $V_{STG4}$ for the fourth charge pump stage 120 that has a voltage level of about 28-30 V. The output of the second charge pump circuit 126 varies based on power conversion efficiency. Moreover, in at least one example, the output of the fourth charge pump stage 120, $V_{STG4}$ feeds into to a fifth charge pump stage 128.

Figure 8:
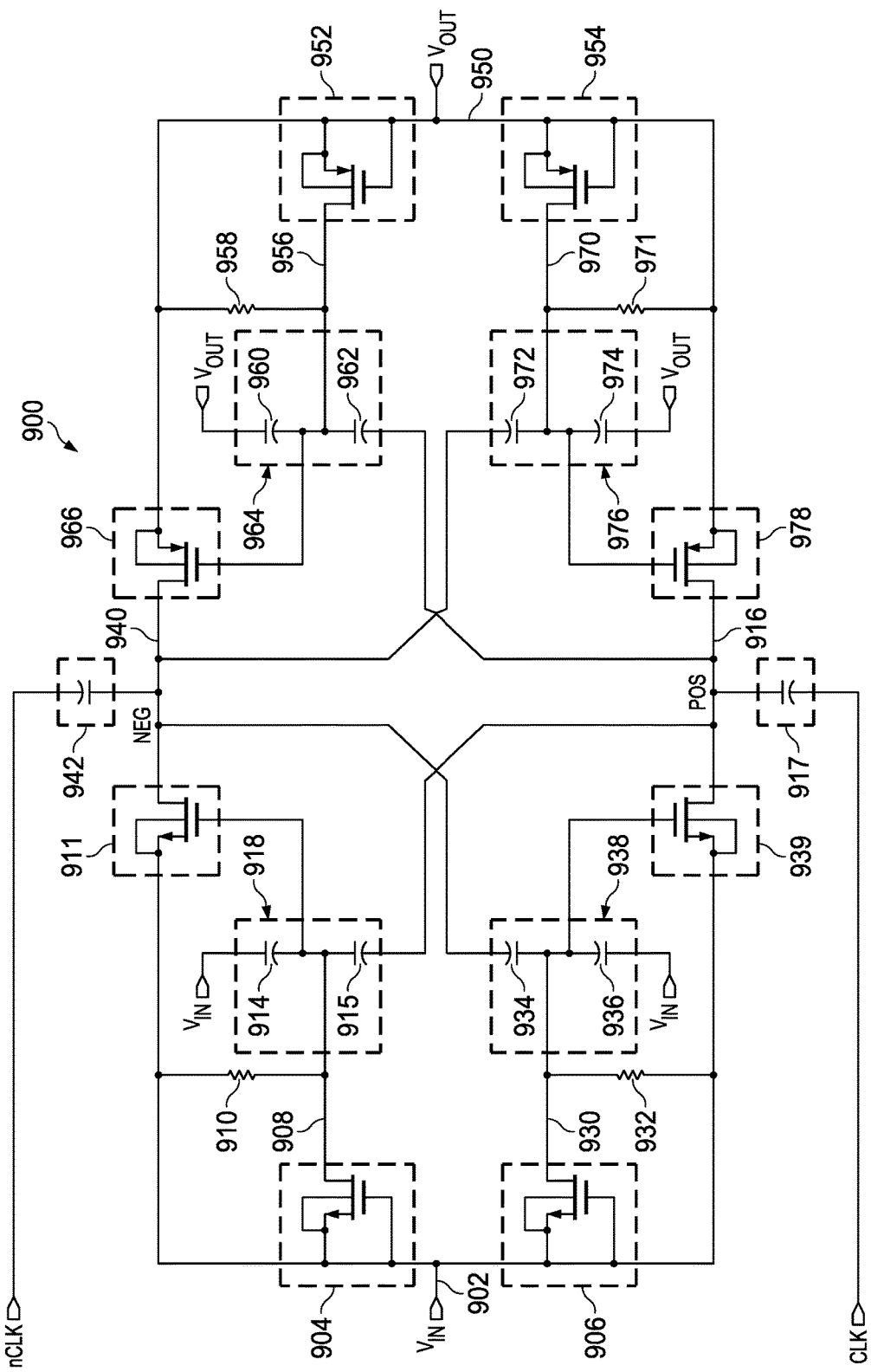
FIG. 8 is a circuit diagram of an example of a third charge pump circuit.

In at least one example, the fifth charge pump stage 128 include a third charge pump circuit 130 that receives the output signal of the fourth charge pump stage 120, $V_{STG4}$ as an input. The fifth charge pump stage 128 also receives the level clock signal, T2CLK and the negative level clock signal, nT2CLK as inputs into the third charge pump circuit 130. FIG. 8 is a circuit diagram of an example of a third charge pump circuit 900 is employable to implement the third charge pump circuit 130 for the fifth charge pump stage 128 of FIG. 2. An input node 902 also receives an input signal, $V_{IN}$ that (as shown in FIG. 2) corresponds to the output of the fourth charge pump stage 120, $V_{STG4}$. In this example, the input node 702 is coupled to a source and a gate of NMOSs 904 and 906. Thus, in this example, the NMOSs 904 and 906 are turned off (cut-off mode). A drain of the NMOS 904 is coupled to a positive input biasing node 908. The positive input biasing node 908 is also coupled to a biasing resistor 910 and a gate of an NMOS 911 and the biasing resistor 910 is coupled to the input node 902.

In at least one example, the positive input biasing node 908 is coupled between a capacitor 914 and a capacitor 915 of a reactance voltage divider 918. The capacitor 914 is also coupled to the input signal, $V_{IN}$. Moreover, in this example, the capacitor 915 is also coupled to a positive node 916 of the third charge pump circuit 900 (labeled in FIG. 8 as "POS"). The positive node 916 is coupled via a capacitor 917 to a clock signal, CLK. The clock signal, CLK corresponds to the level clock signal, T2CLK of FIG. 2.

In at least one example, a drain of the NMOS 906 is coupled to a negative input biasing node 930. The negative input biasing node 930 is coupled to a biasing resistor 932 and the biasing resistor 932 is also coupled to the input node 902. The negative input biasing node 930 is coupled between a capacitor 934 and a capacitor 936 of a reactance voltage divider 938. The capacitor 936 is coupled to the input signal, $V_{IN}$. Moreover, the capacitor 934 is coupled to a negative node 940 of the third charge pump circuit 900 (labeled in FIG. 8 as "NEG"). The negative node 940 is coupled via a capacitor 942 to a negative clock signal, nCLK. The negative clock signal, nCLK corresponds to the negative level clock signal, nT2CLK of FIGS. 1 and 2, such that the clock signal, CLK and the negative clock signal, nCLK are inverted versions of each other. In at least one example, the negative input biasing node 930 is also coupled to a gate of an NMOS 939.

In at least one example, a drain of the NMOS 911 is coupled to the negative node 940 and a source of the NMOS 911 is coupled to the input node 902. Similarly, in this example, a drain of the NMOS 939 is coupled to the positive node 916 and a source of the NMOS 939 that is coupled to the input node 902.

In at least one example, an output node 950 is coupled to a gate and a source of a PMOSs 952 and 954. The output node 950 provides an output signal, $V_{OUT}$ for the third charge pump circuit 900 (shown as $V_{OUT}$ of the multi-stage charge pump 100 of FIG. 2). Moreover, as configured the PMOSs 952 and 854 are turned on (e.g., saturation mode). A drain of the PMOS 952 is coupled to a positive output biasing node 956. The positive output biasing node 956 is coupled to a biasing resistor 958 that is also coupled to the output node 950. In at least one example, the positive output biasing node 956 is also coupled between a capacitor 960 and a capacitor 962 of a reactance voltage divider 964. The capacitor 960 is also coupled to the output signal, $V_{OUT}$ and the capacitor 962 is coupled to the positive node 916. Moreover, the positive output biasing node 956 is coupled to a gate of a PMOS 966. In this example, a source of the PMOS 966 is coupled to the output node 950 and a drain of the PMOS 966 is coupled to the negative node 940.

In at least one example, a drain of the PMOS 954 is coupled to a negative output biasing node 970. The negative output biasing node 970 is coupled between a capacitor 972 and a capacitor 974 of a reactance voltage divider 976. The capacitor 974 is also coupled to the output signal, $V_{OUT}$. Moreover, in this example, the capacitor 972 is coupled to the negative node 940 of the third charge pump circuit 900. Also, in this example, the negative output biasing node 970 is coupled to a gate of a PMOS 978. In this example, a source of the PMOS 978 is coupled to the output node 950 and a drain of the PMOS 978 is coupled to the positive node 916.

In at least one example, the third charge pump circuit 900 generates the output signal, $V_{OUT}$ (corresponding to the output signal, $V_{OUT}$ of the multi-stage charge pump 100 of FIG. 2). In at least one example operation, the input signal, $V_{IN}$ (corresponding to the output of the third charge pump stage 114, $V_{STG3}$) is about 28-30 V. As an example, equation 2 defines an example relationship between $V_{OUT}$ and $V_{IN}$ for the third charge pump circuit 900 (e.g., the same relationship that is defined in equation 1).

$$V_{OUT} \approx V_{IN} + 11 \text{ V} \mp 1 \text{ V} \qquad \text{Equation 2}$$

In at least one example operation, the clock signal, CLK swings between about 0 V and about 18 V in turbo mode and about 6 V and 18 V in steady state at a controlled frequency (dictated by an external circuit). During a high clock pulse of the clock signal, CLK (at which the clock signal, CLK is about 18 V), the negative clock signal, nCLK is about 0 V in turbo mode and 6 V in steady state mode. Thus, during a high clock pulse of the clock signal, CLK, (via the capacitor 917) the positive node 916 is charged (e.g., "pumped voltage") by the clock signal, CLK. Also, a voltage across the resistor 910 sets a biasing point for the positive input biasing node 908.

During the high clock pulse of the clock signal, CLK, the positive node 916 induces a voltage across the reactive voltage divider 918 that drives the positive input biasing node 908 to a voltage between the voltage of the positive node 916 and the voltage of the input signal, $V_{IN}$. For example, when the voltage at the positive input biasing node 908 exceeds the input voltage (coupled to the source of the NMOS 911), the NMOS 911 is turned on (e.g., saturation mode).

Conversely, operating in a similar manner, during a high clock pulse of the clock signal, CLK, the negative clock signal, nCLK is about 0 V in turbo mode or about 6 V in steady state mode. Accordingly, the negative input biasing node 930 that is coupled to the gate of the NMOS 939 drops to a level below the input voltage, $V_{IN}$. Accordingly, the NMOS 939 is turned off (cutoff mode) because the source of the NMOS 939 is coupled to the input signal, $V_{IN}$.

The biasing resistor 971 biases the negative output biasing node 970. Thus, during the high clock pulse of the clock signal CLK, the negative clock signal, nCLK is about 0 V, such that negative node 940 voltage drops, thereby driving the negative output biasing node 970 to a voltage between the voltage of the negative node 940 and the voltage of the output signal, $V_{OUT}$ (coupled to the PMOS 978). Accordingly, the voltage at the negative node 940 is below the voltage of the output signal, $V_{OUT}$ and the PMOS 978 turns on (saturation mode). Conversely, in a similar manner, during a high clock pulse of the clock signal, CLK, the PMOS 966 is turned off (operating in the cutoff mode) because the gate of the PMOS 966 is coupled to the positive output biasing node 956. Accordingly, during a high clock pulse of the clock signal, CLK the input signal, $V_{IN}$, is passed through the NMOS 911 to charge (e.g., pump) the capacitor 942 coupled to the negative node 940.

Upon the clock signal, CLK transitioning to a low state (about 0 V in the turbo mode or about 6 V in the steady state mode), the negative clock signal, nCLK transitions to a high clock pulse of about 18 V. In this situation, the state of some transistor devices is reversed. Accordingly, during a high clock pulse of the negative clocks signal, nCLK, the NMOS 911 is turned off, and the NMOS 939 is turned on. Similarly, during a high clock pulse of the negative clock signal, nCLK, the PMOS 978 is turned off and the PMOS 966 is turned on. Accordingly, during a high clock pulse of the negative clock signal, nCLK current stored in the capacitor 942 drives the output signal, $V_{OUT}$ while the negative clock signal, nCLK to charges (pumps) voltage into the negative node 940, thereby driving the output signal, $V_{OUT}$ to a voltage level higher than the input signal, $V_{IN}$ (e.g., about 10-12 V higher). Also, during a high clock pulse of the negative clock signal, nCLK, the negative node 940 is charged by the negative clock signal, nCLK via the capacitor 942.

Also, the NMOS 911 is turned off because the gate of the NMOS 911 is coupled to the positive input biasing node 908 and the NMOS 939 is turned on because the gate of the NMOS 939 is coupled to the negative input biasing node 930. Accordingly, during a high clock pulse of the negative clock, nCLK, the capacitor 917 is charged by the input signal, $V_{IN}$. Upon the clock signal, CLK switching back to a high clock pulse, the negative clock signal, nCLK switches to a low state. Accordingly, the current in the capacitor 917 charges the output signal, $V_{OUT}$ and the clock signal, CLK continues to charge (e.g., pump) the positive node 916, thereby driving the positive node 916 to a voltage level higher than the input signal, $V_{IN}$ (e.g., about 10-12 V higher). Accordingly, at times when the clock signal, CLK is at a high pulse, or at a low state, the output signal $V_{OUT}$ is about 10-12 V higher than the input voltage $V_{IN}$. Accordingly, in examples where the input signal, $V_{IN}$ (corresponding to $V_{STG4}$) is about 28-30 V (corresponding to the output of the fourth charge pump stage 120, $V_{STG4}$) the output signal $V_{OUT}$ is about 38-40 V.

By selecting capacitance ratios at the reactance voltage dividers 918, 938, 964 and 976 respective gate to source voltages for the NMOSs 911 and 939 and for the PMOSs 966 and 978 are kept to a voltage level below a predetermined acceptable limit (e.g., about 7 V). Thus, by implementing the reactance voltage dividers 918, 938, 964 and 976, IC chip compatible transistor devices are employable.

Moreover, the capacitors 914, 915, 934, 936, 960, 962, 972, 974, 917 and 942 of the third charge pump circuit 900, are exposed to voltage swings (drops) of about 30 V during operation in the turbo mode, which has a predetermined duty cycle (e.g., about 1% or less). During operation in the steady state mode (with a predetermined duty cycle of 99% or more), the capacitors 914, 915, 934, 936, 960, 962, 972, 974, 917 and 942 are exposed to voltage swings of up to about 24 V because, in the steady state mode, the clock signal, CLK and the negative clock signal, nCLK swing between about 6 V and 18 V. Accordingly, in at least one example, the capacitors 914, 915, 934, 936, 960, 962, 972, 974, 917 and 942 are formed as metal plate capacitors (e.g., MFLUX capacitors).

Referring again to FIG. 2, the third charge pump circuit 130 of the fifth charge pump stage 128 boosts $V_{STG4}$ by about 10-12 V to generate an output signal $V_{OUT}$ for the multi-stage charge pump 100. The boost level varies based on energy conversion efficiency. The output signal, $V_{OUT}$ of the fifth charge pump stage 128 (and of the multi-stage charge pump 100) has voltage level of about 38-40 V. In at least one example, the output signal, $V_{OUT}$ drives the load 102. In at least one example, the load 102 is external to the IC chip that houses the multi-stage charge pump 100. In at least one other example, the load 102 is external to the IC chip that houses the multi-stage charge pump 100.

In at least one example, by implementing the multi-stage charge pump 100 in the manner described, the input signal, $V_{IN}$ is boosted from a range of about 5.5-6.5 V to about 38-40 V. Also, the multi-stage charge pump 100 has a duty cycle in the steady state mode of about 99% or more. In the steady state mode, the polysilicon capacitors operating in the first charge pump circuits 106, 111 and 115 of the first-third charge pump stages 104, 110 and 114 and the second charge pump circuit 126 are exposed to voltage swings (drops) of less than about 12 V. Accordingly, the polysilicon capacitors operate within standard reliability parameters in the steady state mode. Also, in at least one example, in the steady state mode the metal plate capacitors of the third charge pump circuit 130 are exposed to voltage swings of up to about 24 V, while still operating within standard reliability parameters.

Furthermore, the multi-stage charge pump 100 has a duty cycle in the turbo mode of about 1% or less, in which the polysilicon capacitors of the first charge pump circuits 106, 111 and 115 and the second charge pump circuit 126 are exposed to a voltage drop of up to about 18 V. In at least one example, due to the low duty cycle (1% or less) in the turbo mode of the multi-stage charge pump, the polysilicon capacitors still operate within standard reliability parameters.

Also, in at least one example, in the turbo mode the metal plate capacitors of the third charge pump circuit 130 are exposed to voltage swings of about 30 V, while still operating within standard reliability parameters. Thus, by operating the multi-stage charge pump 100 in the turbo mode with a 1% duty cycle or less, capacitors of the first charge pump circuits 106, 111 and 115, the second charge pump circuit 126 and the third charge pump circuit 130 each operate within acceptable reliability parameters.

Furthermore, by limiting employment of the metal plate capacitors to the fifth (final) charge pump stage 128 (at the third charge pump circuit 130), a reduced die area and increased power efficiency is achievable in examples where the multi-stage charge pump 100 is implemented on an IC chip. Stated differently, by employing mostly relatively physically small, power efficient polysilicon capacitors in the multi-stage charge pump 100 (specifically at the first-fourth charge pump stages 104, 110, 114 and 120), the multi-stage charge pump 100 is deployable on a relatively small portion of a die. Moreover, the multi-stage charge pump 100 operates with five (5) charge pump stages and the level shifter 116 (and the biasing circuit 117), thereby achieving a relatively power efficient charge pump.

In this description, the term "based on" means based at least in part on. Modifications are possible in the described embodiments, and other embodiments are possible, within the scope of the claims.

What is claimed is:
1. A multi-stage charge pump comprising:
   first, second and third charge pump stages connected in series, wherein each of the first, second and third charge pump stages comprises a charge pump circuit of a first type to increase an input signal of a respective charge pump circuit by up to a given amount;

a level shifter to swing a level clock signal between a voltage of an output of the third charge pump stage and one of an offset voltage and a ground;

a charge pump circuit of a second type to increase the voltage of the output of the third charge pump stage by up to an other amount set by the level shifter and to provide an output; and a charge pump circuit of a third type to increase a voltage of the output of the charge pump circuit of the second type by up to about the other amount.

2. The multi-stage charge pump of claim 1, wherein the first charge pump stage further comprises a bypass switch to bypass the charge pump circuit of the first charge pump stage, wherein the bypass switch is controllable in response to a mode signal.

3. The multi-stage charge pump of claim 2, wherein the level shifter is configured to swing the level clock signal between the voltage of the output of the third charge pump stage and the offset voltage in response to the mode signal indicating that the multi-stage charge pump is operating in a steady state mode, and wherein the level shifter is operable to swing the level clock signal between the voltage of the output of the third charge pump stage and the ground in response to the mode signal indicating that the multi-stage charge pump is operating in a turbo mode.

4. The multi-stage charge pump of claim 3, wherein the second and third charge pump stages are configured to increase the voltage of the respective input signals by a greater amount in the steady state mode than the turbo mode.

5. The multi-stage charge pump of claim 1, wherein the charge pump circuit of the second type and the charge pump circuit of the third type each includes a charge pump having reactive voltage dividers to limit a voltage at an input node of a respective transistor device.

6. The multi-stage charge pump of claim 1, wherein the charge pump circuit of the third type comprises a metal plate capacitor.

7. The multi-stage charge pump of claim 1, wherein each of the first, second and third charge pump stages includes capacitors to facilitate charge pumping, and the capacitors have a duty cycle of about 1% or less for exposure to a voltage swing over about 12 V.

8. The multi-stage charge pump of claim 7, wherein the charge pump circuits of the first and second types exclude a metal plate capacitor.

9. An integrated circuit (IC) chip comprising the multi-stage charge pump of claim 1.

10. The multi-stage charge pump of claim 1, wherein the charge pump circuit of the first charge pump stage is controllable with a given clock signal, and the charge pump circuits of the second and third charge pump stages are controllable by an other clock signal, wherein the given clock signal has a greater frequency than the other clock signal.

11. The multi-stage charge pump of claim 1, wherein the first charge pump stage is coupled to receive an input signal having a voltage between about 5 V and about 7 V, and the charge pump circuit of the third type is coupled to provide an output signal with a voltage of at least about 38 V.

12. The multi-stage charge pump of claim 1, further comprising a biasing circuit, coupled to receive the output of each of the first, second and third charge pump stages, to provide biasing signals to the level shifter based on the output of each of the first, second and third charge pump stages.

13. The multi-stage charge pump of claim 12, wherein the biasing circuit is coupled to provide the offset voltage to the level shifter based on the input signal of the first charge pump and the mode signal.

14. The multi-stage charge pump of claim 1, wherein the level shifter comprises three sub-level shifters connected to swing the level clock signal between the voltage of the output of the third charge pump stage and the ground in a turbo mode and to swing the level clock signal between the voltage of the output of the third charge pump stage and the offset voltage in a steady state mode.

15. An integrated circuit (IC) chip comprising:

first, second and third charge pump stages connected in series, wherein each of the first, second and third charge pump stages is configured to increase an input signal of a respective charge pump circuit by up to a given amount;

a biasing circuit to generate an offset voltage in response to an input of the first charge pump stage and an output of the first, second and third charge pump stages;

a level shifter to swing a clock signal between a voltage of the output of the third charge pump stage and a ground in a turbo mode and to swing the clock signal between a voltage of the output of the third charge pump stage and the offset voltage in a steady state mode;

a fourth charge pump stage to increase the voltage of the output of the third charge pump stage by up to an other amount and to provide an output, wherein each of the first, second, third and fourth charge pump stages excludes metal plate capacitors; and a fifth charge pump stage to increase a voltage of the output of the fourth charge pump stage by up to about the other amount.

16. The multi-stage charge pump of claim 15, wherein a clock signal input into the first charge pump stage has a higher frequency than a clock signal input into the second and third charge pump stages.

17. The multi-stage charge pump of claim 15, wherein the first charge pump stage further comprises a bypass switch to bypass a charge pump circuit in the first charge pump stage, the charge pump circuit being bypassed in the steady state mode.

18. An integrated circuit (IC) chip comprising:

charge pump stages connected in series, comprising a charge pump circuit of a first type;

a biasing circuit to generate an offset voltage in response to an output from the charge pump stages and an input signal applied to a first charge pump stage of the charge pump stages;

a level shifter to swing a clock signal between a voltage of an output of a last charge pump stage of the charge pump stages and a ground in a turbo mode and to swing the clock signal between the voltage of the output of the last charge pump stage and the offset voltage in a steady state mode; and a next charge pump circuit of a second type, the next charge pump circuit being configured to increase the voltage of the output of the last charge pump stage by up to an amount approximating the output of the last charge pump stage and to provide an output.

19. The IC chip of claim 18, further comprising a final charge pump circuit of a third type, the final charge pump circuit being configured to increase a voltage of the output of the next charge pump circuit by the amount approximating the output of the last charge pump stage.

20. The IC chip of claim 18, wherein capacitors in the charge pump stages are connected in series and in the next charge pump circuit are exposed to voltage swings of about 12 V or less in the steady state mode.

* * * * *